United States Patent
Jung et al.

(10) Patent No.: US 7,462,865 B2
(45) Date of Patent: Dec. 9, 2008

(54) DISPLAY AND MANUFACTURING METHOD THEREOF

(75) Inventors: Kwang-Chul Jung, Seongnam-si (KR); Joon-Hoo Choi, Seoul (KR); Joon-Chul Goh, Seoul (KR)

(73) Assignee: Samsung Electronics Co., Ltd. (KR)

( * ) Notice: Subject to any disclaimer, the term of this patent is extended or adjusted under 35 U.S.C. 154(b) by 28 days.

(21) Appl. No.: 11/524,477

(22) Filed: Sep. 20, 2006

(65) Prior Publication Data

US 2007/0126939 A1 Jun. 7, 2007

(30) Foreign Application Priority Data

Dec. 7, 2005 (KR) .................. 10-2005-0118537

(51) Int. Cl.
*H01L 29/04* (2006.01)
(52) U.S. Cl. .......................... 257/59; 257/72
(58) Field of Classification Search .................. 257/59, 257/72, 775
See application file for complete search history.

(56) References Cited

U.S. PATENT DOCUMENTS 5,150,181 A * 9/1992 Takeda et al. .................. 257/57
6,239,468 B1 * 5/2001 Chang et al. ................. 257/347
6,900,470 B2 * 5/2005 Kobayashi et al. ............ 257/88

FOREIGN PATENT DOCUMENTS

| JP | 07-162010 | 6/1995 |
| JP | 2001-135645 | 5/2001 |
| JP | 2001-209070 | 8/2001 |
| JP | 2004-071984 | 3/2004 |
| JP | 2004-158530 | 6/2004 |
| JP | 2005-196183 | 7/2005 |
| KR | 1020020096228 A | 12/2002 |

\* cited by examiner

*Primary Examiner*—Mark Prenty
(74) *Attorney, Agent, or Firm*—Cantor Colburn LLP

(57) ABSTRACT

A display includes a substrate, a control electrode formed on the substrate, input and output electrodes formed on the substrate having facing sides facing each other with respect to the control electrode, a semiconductor layer contacting the input and the output electrodes, and an insulating layer formed between the control electrode and the semiconductor layer. At least one of the facing sides of the input and output electrodes on the semiconductor layer has a plurality of protrusions. The channel between the input and output electrodes is formed with various shapes, the length of the channel is prevented from being extending by a skew phenomenon, and the width of the channel may be extended.

16 Claims, 31 Drawing Sheets

DISPLAY AND MANUFACTURING METHOD THEREOF

This application claims priority to Korean Patent Application No. 10-2005-0118537, filed on Dec. 7, 2005 and all the benefits accruing therefrom under 35 U.S.C. §119, and the contents of which in its entirety are herein incorporated by reference.

BACKGROUND OF THE INVENTION (a) Field of the Invention

The present invention relates to a display and a manufacturing method thereof. More particularly, the present invention relates to a display capable of properly flowing current therein, and a manufacturing method of the display.

(b) Description of the Related Art

Recent trends toward lightweight and thin personal computers and television sets also require lightweight and thin display devices, and flat panel displays satisfying such a requirement are being substituted for conventional cathode ray tubes ("CRTs").

Flat panel displays include a liquid crystal display ("LCD"), a field emission display ("FED"), an organic light emitting diode ("OLED") display, a plasma display panel ("PDP"), and so on.

Among the flat panel displays, the OLED display has advantages because of its low power consumption, fast response time, wide viewing angle, and high contrast ratio.

An OLED display is a self emissive display device, which includes two electrodes and an organic light emitting layer interposed between the two electrodes. One of the two electrodes injects holes and the other injects electrons into the light emitting layer. The injected electrons and holes are combined to form excitons and the excitons emit light as discharge energy.

Because the magnitude of the current of the OLED is influenced by the ratio of the length and the width of the channel of a driving transistor, it is preferable that the channel be formed with accuracy.

However, because of a skew phenomenon in which a metal layer is over-etched is generated when wet-etching the metal layer to form a signal line, the length of the channel becomes longer than a predetermined length and the required current does not flow properly. To prevent this problem, the width of the channel may be extended to compensate the increased length of the channel, but the aperture ratio of the pixels of the OLED may thereby be reduced.

BRIEF SUMMARY OF THE INVENTION

The present invention provides an OLED in consideration of the skew.

Exemplary embodiments of the present invention include a display having a substrate, a control electrode formed on the substrate, input and output electrodes formed on the substrate including facing sides facing each other with respect to the control electrode, a semiconductor layer contacting the input and output electrodes, and an insulating layer formed between the control electrode and the semiconductor layer. At least one of the facing sides of the input and output electrodes on the semiconductor layer has a plurality of protrusions.

The protrusions may be triangular, trapezoidal, or semicircular. It is preferable that the protrusions of the input and output electrodes are alternately disposed. The protrusions of the input and output electrodes may have a right triangle shape including an oblique side and a right side. The oblique side of each protrusion of the input electrode may face the right side of the protrusion of the output electrode. Alternatively, the oblique side of each protrusion of the input electrode may face the oblique side of each protrusion of the output electrode. When the protrusions have the trapezoidal shape, the trapezoidal shape of the protrusions of the input and output electrodes may be symmetrical with respect to a centerline between the input and output electrodes.

The sizes of the protrusions of the input and output electrodes may be substantially the same or different.

The neighboring protrusions of the input electrodes may be directly connected to each other and the neighboring protrusions of the output electrodes may be directly connected to each other. Alternatively, the neighboring protrusions of the input electrodes and the neighboring protrusions of the output electrodes may be connected to each other with a predetermined interval there between.

The display further may include a pixel electrode connected to the output electrode, a common electrode facing the pixel electrode, and an organic light emitting member formed between the pixel electrode and the common electrode.

A channel may be formed between the facing sides of the input and output electrodes, and a first dimension of the channel measured from a first end of the channel to a second end of the channel, which is greater than a linear distance measured from the a first end of the input and output electrodes to a second end of the input and output electrodes, is maximized by the protrusions. The protrusions may prevent a second dimension of the channel, measured between the facing sides of the input and output electrodes, from becoming over-etched during manufacture of the input and output electrodes.

Exemplary embodiments of the present invention also include a display which includes a substrate, first and second signal lines intersecting each other and formed on the substrate, a driving voltage line formed on the substrate for transmitting a first voltage, a first thin film transistor ("TFT") connected to the first and second signal lines, and a second TFT connected to the first TFT and the driving voltage line. The second TFT includes a control electrode formed on the substrate, input and output electrodes formed on the substrate having facing sides facing each other with respect to the control electrode, a semiconductor layer contacting the input and output electrodes, and an insulating layer formed between the control electrode and the semiconductor layer, wherein at least one of the facing sides of the input and output electrodes on the semiconductor layer has a plurality of protrusions.

The display may further include a passivation layer formed on the first and second TFTs, a first electrode connected to the second TFT and formed in the passivation layer, a second electrode facing the first electrode and transmitting a second voltage, and an organic light emitting member formed between the first electrode and the second electrode.

Exemplary embodiments of the present invention also include a method for manufacturing a display, where the method includes forming a control electrode on a substrate, forming an insulating layer on the substrate and the control electrode, forming a semiconductor layer on the insulating layer of the control electrode, and forming input and output electrodes on the semiconductor layer and forming facing sides of the input and output electrodes facing each other with respect to the control electrode through a photolithography process. At least one of the facing sides of the input and output electrodes on the semiconductor layer has a plurality of protrusions.

The protrusions may have an embossed shape, and the protrusions of the input and output electrodes may be alternately disposed.

BRIEF DESCRIPTION OF THE DRAWINGS

The present invention will become more apparent by describing exemplary embodiments thereof with reference to the accompanying drawings, in which.

DETAILED DESCRIPTION OF THE INVENTION

Figure 1:
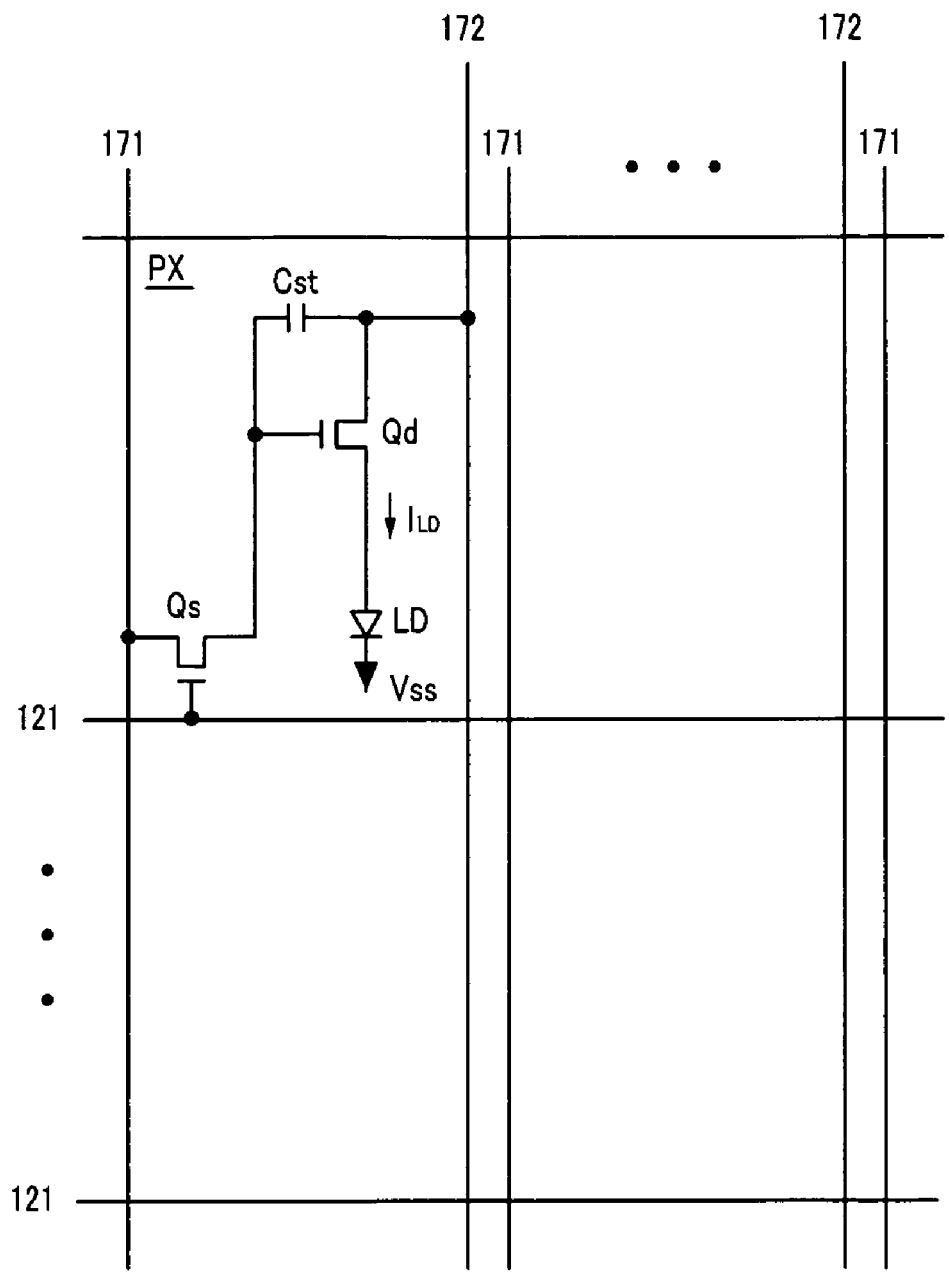
FIG. 1 is an equivalent circuit diagram of an exemplary pixel of an exemplary OLED according to an exemplary embodiment of the present invention.

The present invention now will be described more fully hereinafter with reference to the accompanying drawings, in which exemplary embodiments of the invention are shown. The present invention may, however, be embodied in many different forms and should not be construed as limited to the embodiments set forth herein.

In the drawings, the thickness of layers, films, panels, regions, etc., are exaggerated for clarity. Like numerals refer to like elements throughout. It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Now, an OLED according to an exemplary embodiment of the present invention will be described with reference to FIG. 1.

FIG. 1 is an equivalent circuit diagram of an exemplary pixel of an exemplary OLED according to an exemplary embodiment of the present invention.

Referring to FIG. 1, an OLED display includes a plurality of signal lines 121, 171, and 172, and a plurality of pixels PX connected thereto and arranged substantially in a matrix.

The signal lines include a plurality of gate lines 121 for transmitting gate signals (or scanning signals), a plurality of data lines 171 for transmitting data signals (or source signals), and a plurality of driving voltage lines 172 for transmitting a driving voltage. The gate lines 121 extend substantially in a row direction, a first direction, and substantially parallel to each other, while the data lines 171 and the driving voltage lines 172 extend substantially in a column direction, a second direction, and substantially parallel to each other. The first direction may be substantially perpendicular to the second direction.

Each pixel PX includes a switching transistor Qs, a driving transistor Qd, a capacitor Cst, and an OLED LD or other light emitting member.

The switching transistor Qs has a control terminal, such as a gate electrode, connected to one of the gate lines 121, an input terminal, such as a source electrode, connected to one of the data lines 171, and an output terminal, such as a drain electrode, connected to the driving transistor Qd. The switching transistor Qs transmits the data signals applied to the data line 171 to the driving transistor Qd in response to the gate signal applied to the gate line 121.

The driving transistor Qd has a control terminal connected to the switching transistor Qs, an input terminal connected to the driving voltage line 172, and an output terminal connected to the OLED LD. The driving transistor Qd drives an output current ILD having a magnitude depending on the voltage between the control terminal and the output terminal thereof.

The capacitor Cst is connected between the control terminal and the input terminal of the driving transistor Qd. The capacitor Cst stores the data signal applied to the control terminal of the driving transistor Qd and maintains the data signal after the switching transistor Qs turns off.

The OLED LD has an anode connected to the output terminal of the driving transistor Qd and a cathode connected to a common voltage Vss. The OLED LD emits light having an intensity depending on an output current ILD of the driving transistor Qd, thereby displaying images.

The switching transistor Qs and the driving transistor Qd are n-channel field effect transistors ("FETs"). However, at least one of switching transistor Qs and the driving transistor Qd may be a p-channel FET. In addition, the connections among the transistors Qs and Qd, the capacitor Cst, and the OLED LD may be modified.

Referring to FIGS. 2 to 5, a structure of a portion of the OLED display shown in FIG. 1 according to an exemplary embodiment of the present invention will be described.

Figure 2:
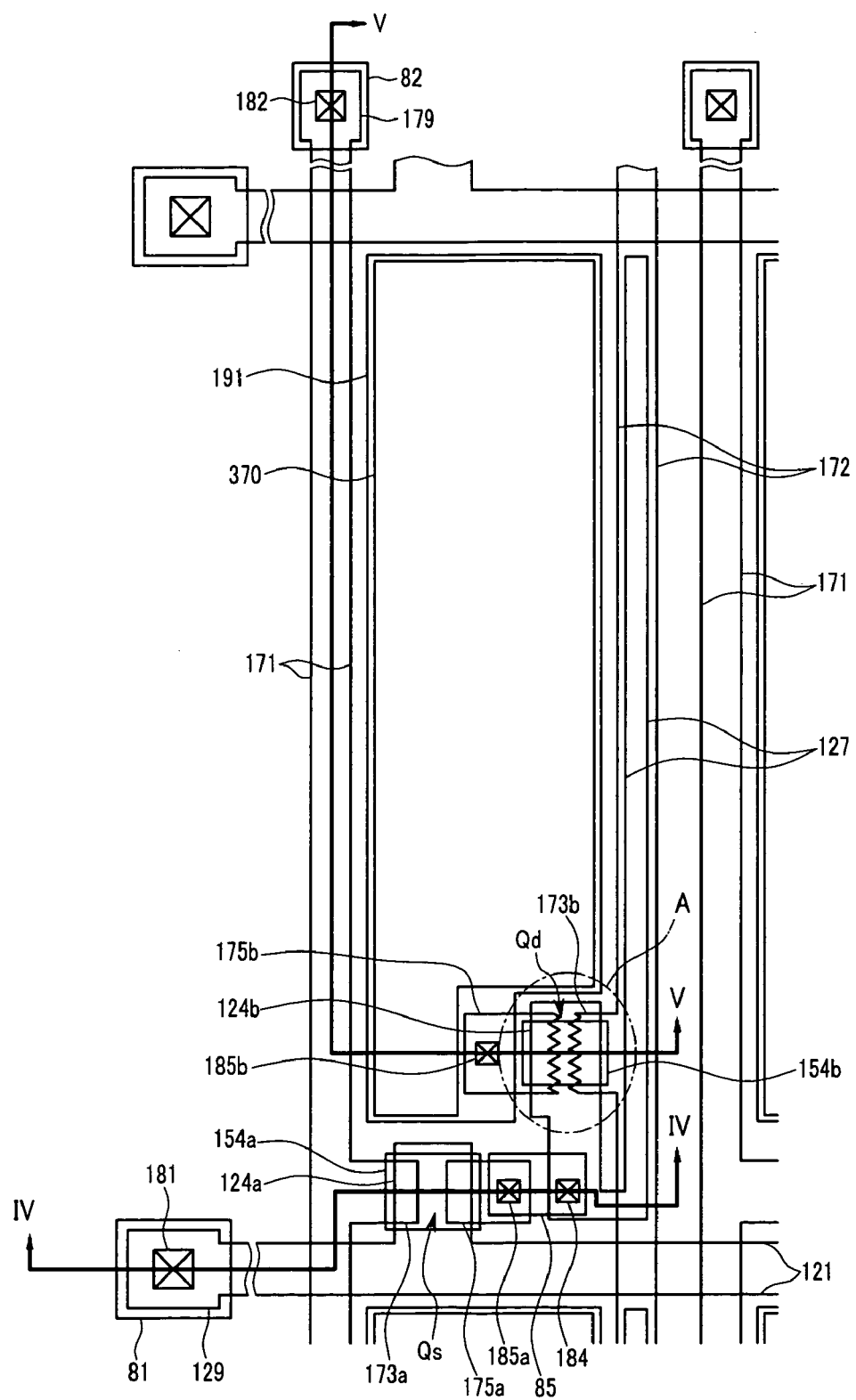
FIG. 2 is a schematic plan view of a portion of an exemplary OLED according to an exemplary embodiment of the present invention.
Figure 3:
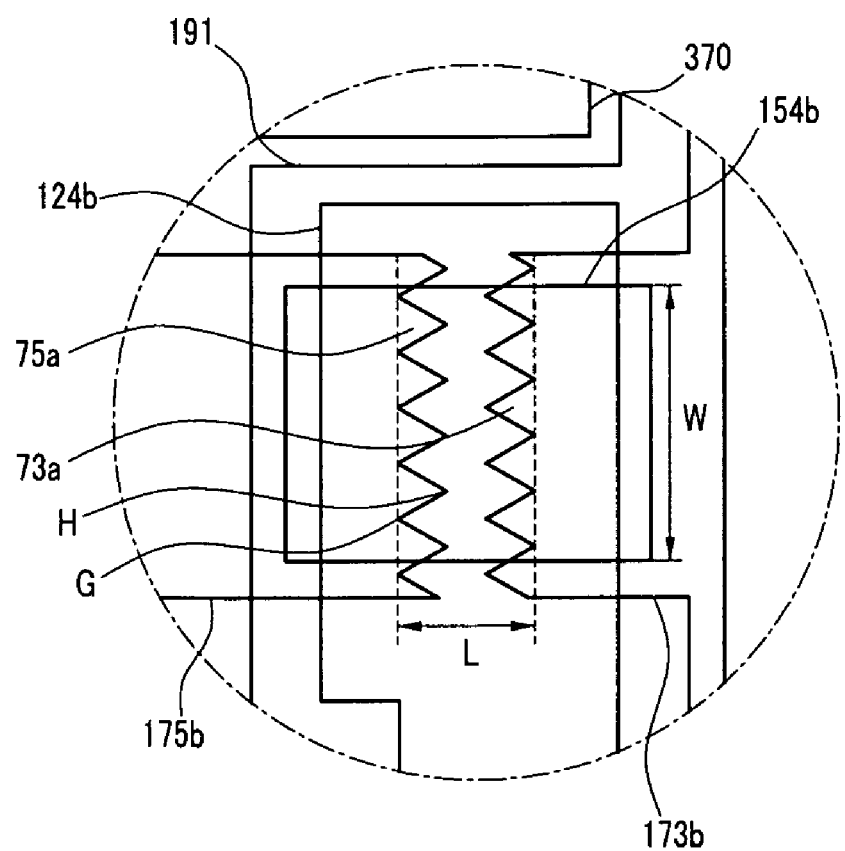
FIG. 3 is an enlarged view of portion A in the exemplary OLED of FIG. 2.
Figure 4:
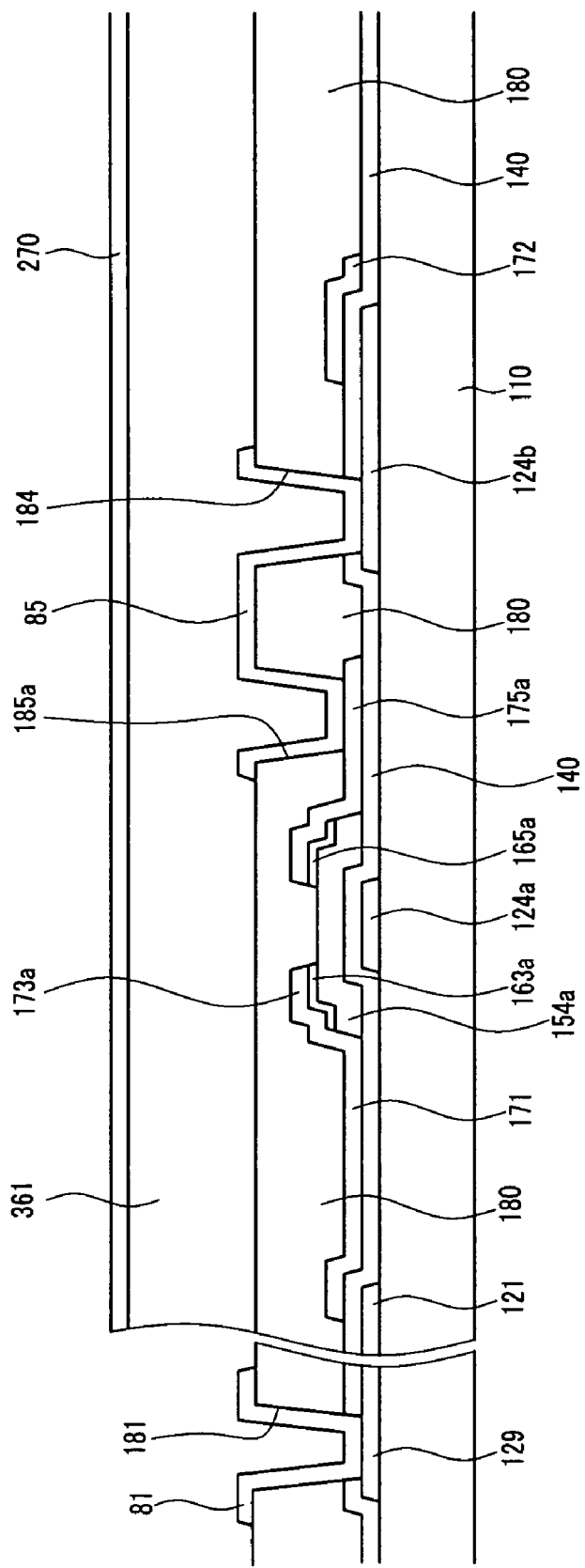
FIGS. 4 and 5 are sectional views of the exemplary OLED shown in FIG. 2 taken along lines IV-IV and V-V.
Figure 5:
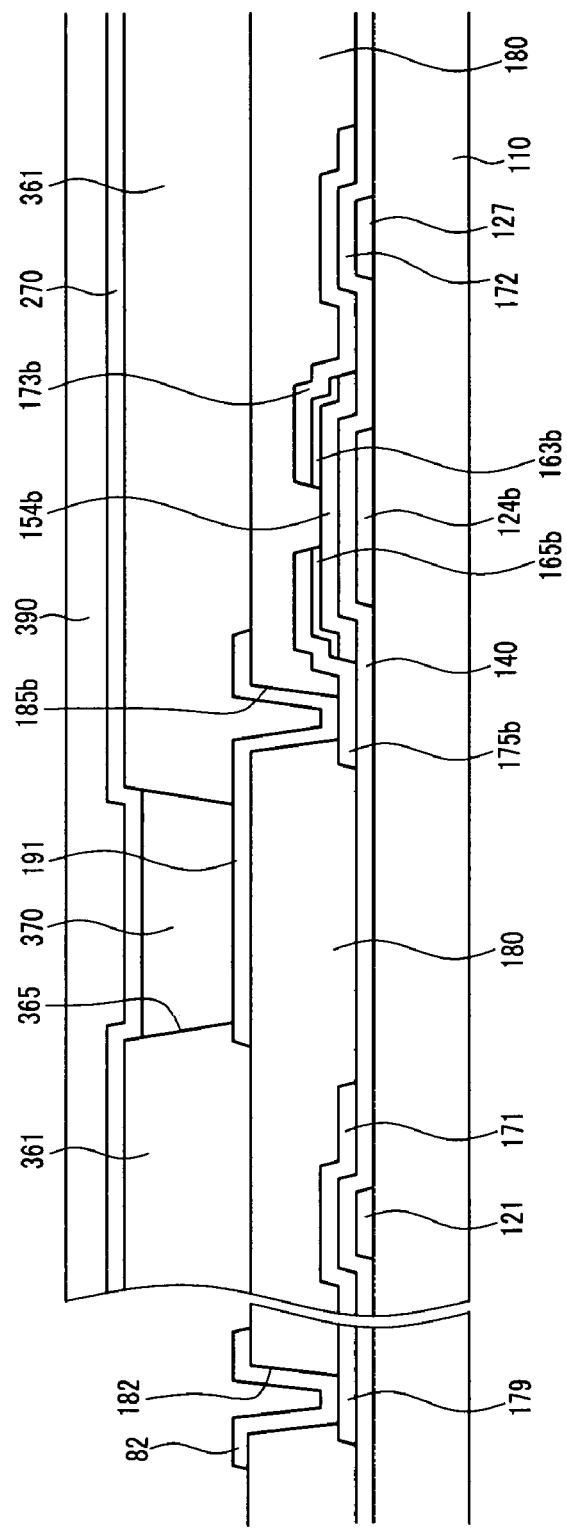

FIG. 2 is a schematic plan view of a portion of an exemplary OLED according to an exemplary embodiment of the present invention, FIG. 3 is an enlarged view of portion A in the exemplary OLED of FIG. 2, and FIGS. 4 and 5 are sectional views of the exemplary OLED shown in FIG. 2 taken along lines IV-IV and V-V.

A plurality of gate conductors that include a plurality of gate lines 121 including first control electrodes 124a and second control electrodes 124b, are formed on an insulating substrate 110 made of a material such as transparent glass or plastic.

The gate lines 121 for transmitting gate signals extend substantially in a transverse direction, a first direction. Each gate line 121 further includes an end portion 129 having a large area for contact with another layer or an external driving circuit, and the first control electrodes 124a project upward from the gate line 121, such as in a direction towards an adjacent gate line 121. The gate lines 121 may extend to be directly connected to a gate driving circuit (not shown) for generating the gate signals, which may be integrated on the substrate 110.

Each of the second control electrodes 124b is separated from the gate lines 121 and extends downward, rightward, and upward, such as in a "J" or fish hook configuration, to form a storage electrode 127 positioned between an adjacent pair of gate lines 121.

The gate conductors 121 and 124b are preferably made of an aluminum Al-containing metal such as Al and an Al alloy, a silver Ag-containing metal such as Ag and a Ag alloy, a copper Cu-containing metal such as Cu and Cu alloy, a molybdenum Mo-containing metal such as Mo and a Mo alloy, chromium Cr, tantalum Ta, titanium Ti, etc. The gate conductors 121 and 124b may have a multilayered structure including two films having different physical characteristics. In such a multilayered structure, one of the two films may be made of a low resistivity metal such as an Al-containing metal, a Ag-containing metal, and a Cu-containing metal for reducing signal delay or voltage drop, and the other film may be made of a material such as a Mo-containing metal, Cr, Ta, or Ti, which has good physical, chemical, and electrical contact characteristics with other materials such as indium tin oxide ("ITO") or indium zinc oxide ("IZO"). Good examples of the combination include a lower Cr film and an upper Al (alloy) film, and a lower Al (alloy) film and an upper Mo (alloy) film. However, the gate conductors 121 and 124b may be made of various other metals or conductors.

The lateral sides of the gate conductors 121 and 124b are inclined relative to a surface of the substrate 110, and the inclination angle thereof ranges from about 30 to about 80 degrees.

A gate insulating layer 140 preferably made of, but not limited to, silicon nitride (SiNx) or silicon oxide (SiOx) is formed on the gate conductors 121 and 124b, and may be further formed on exposed surfaces of the substrate 110.

A plurality of semiconductor islands 154a and 154b preferably made of hydrogenated amorphous silicon ("a-Si") or polysilicon are formed on the gate insulating layer 140. The semiconductor islands 154a and 154b are respectively disposed on the first and second control electrodes 124a and 124b.

A plurality of pairs of first ohmic contacts 163a and 165a and a plurality of pairs of second ohmic contacts 163b and 165b are formed on the semiconductor islands 154a and 154b, respectively. The ohmic contacts 163a, 163b, 165a, and 165b are preferably made of silicide or n+ hydrogenated a-Si heavily doped with an n-type impurity such as phosphorous. The first ohmic contacts 163a and 165a are located in pairs and spaced apart from each other on the semiconductor islands 154a, and the second ohmic contacts 163b and 165b are located in pairs and spaced apart from each other on the semiconductor islands 154b.

A plurality of data conductors including a plurality of data lines 171, a plurality of driving voltage lines 172, and a plurality of first and second output electrodes 175a and 175b are formed on the ohmic contacts 163a, 163b, 165b, and 165b and the gate insulating layer 140.

The data lines 171 for transmitting data signals extend substantially in the longitudinal direction, a second direction, and intersect the gate lines 121. The second direction may be substantially perpendicular to the first direction. Each data line 171 includes a plurality of first input electrodes 173a extending toward the first control electrodes 124a and an end portion 179 having a large area for contact with another layer or an external driving circuit. The data lines 171 may extend to be directly connected to a data driving circuit (not shown) for generating the data signals, which may be integrated on the substrate 110.

The driving voltage lines 172 for transmitting driving voltages extend substantially in the longitudinal direction, the second direction, and intersect the gate lines 121. Each driving voltage line 172 includes a plurality of second input electrodes 173b extending toward the second control electrodes 124b, and overlaps the storage electrode 127. The driving voltage lines 172 are disposed between adjacent data lines 171.

The first and second output electrodes 175a and 175b are separated from each other and from the data lines 171 and the driving voltage lines 172. Each pair of the first input electrodes 173a and the first output electrodes 175a are disposed opposite each other with respect to a first control electrode 124a and over the semiconductor island or member 154a so as to expose a channel of the semiconductor island or member 154a, and each pair of the second input electrodes 173b and the second output electrodes 175b are disposed opposite each other with respect to a second control electrode 124b and over the semiconductor island or member 154b so as to expose a channel of the semiconductor island or member 154b.

Referring to FIG. 3, the sides of the second input electrodes 173b and the second output electrodes 175b that face in parallel to each other have a plurality of protrusions 73a and 75a with triangular shapes. The protrusions 73a of the second input electrodes 173b and the protrusions 75a of the second output electrodes 175b are alternately disposed so as to form complementary patterns.

The data conductors 171, 172, 175a, and 175b are preferably made of a refractory metal such as Mo, Cr, Ta, Ti, or alloys thereof. They may have a multilayered structure including a refractory metal film and a low resistivity film. Good examples of the multilayered structure include a double-layered structure including a lower Cr film and an upper Al (alloy) film, a double-layered structure of a lower Mo (alloy) film and an upper Al (alloy) film, and a triple-layered structure of a lower Mo (alloy) film, an intermediate Al (alloy) film, and an upper Mo (alloy) film. However, the data conductors 171, 172, 175a, and 175b may be made of various other metals or conductors.

Like the gate conductors 121 and 124b, the data conductors 171, 172, 175a, and 175b have inclined edge profiles, and the inclination angles thereof range from about 30 to about 80 degrees.

The ohmic contacts 163a, 165a, 163b, and 165b are interposed only between the underlying semiconductor members 154a and 154b and the overlying data conductors 171, 172, 175a, and 175b, and reduce the contact resistance there between. The semiconductor members 154a and 154b include a plurality of exposed portions, which are not covered with the data conductors 171, 172, 175a, and 175b, or the ohmic contacts 163a, 165a, 163b, and 165b, such as portions disposed between the first input and output electrodes 173a and 175a and between the second input and output electrodes 173b and 175b.

A passivation layer 180 is formed on the data conductors 171, 172, 175a, and 175b and the exposed portions of the semiconductor members 154a and 154b. The passivation layer 180 is also formed on any exposed surface of the gate insulating layer 140. The passivation layer 180 is preferably made of an inorganic or organic insulator, and it may have a flat top surface. Examples of the inorganic insulator include silicon nitride and silicon oxide. The organic insulator may have photosensitivity and a dielectric constant of less than about 4.0. The passivation layer 180 may include a lower film of an inorganic insulator and an upper film of an organic insulator such that it takes the excellent insulating characteristics of the organic insulator while preventing the exposed portions of the semiconductor members 154a and 154b from being damaged by the organic insulator.

The passivation layer 180 has a plurality of contact holes 182, 185a, and 185b exposing the end portions 179 of the data lines 171, the first output electrodes 175a, and the second output electrodes 175b, respectively, and the passivation layer 180 and the gate insulating layer 140 have a plurality of contact holes 181 and 184 exposing the end portions 129 of the gate lines 121 and the second control electrodes 124b, respectively.

A plurality of pixel electrodes 191, a plurality of connecting members 85, and a plurality of contact assistants 81 and 82 are formed on the passivation layer 180, and are preferably made of a transparent conductor such as ITO or IZO, or a reflective conductor such as Al, Ag, or alloys thereof.

The pixel electrodes 191 are connected to the second output electrodes 175b through the contact holes 185b. The connecting members 85 are connected to the second control electrodes 124b and the first output electrodes 175a through the contact holes 184 and 185b, respectively, thus connecting the first output electrodes 175a to the second control electrodes 124b.

The contact assistants 81 and 82 are connected to the end portions 129 of the gate lines 121 and the end portions 179 of the data lines 171 through the contact holes 181 and 182, respectively, and they protect the end portions 129 and 179 and enhance the adhesion between the end portions 129 and 179 and external devices.

A partition 361 is formed on the passivation layer 180. The partition 361 surrounds the pixel electrodes 191 like a bank to define openings 365 over the pixel electrodes 191, and the partition 361 is preferably made of an organic or inorganic insulating material. The partition 361 may be made of a photosensitive material containing a black pigment so that the black partition 361 may serve as a light blocking member and the formation of the partition 361 may be simplified.

A plurality of light emitting members 370 are formed on the pixel electrodes 191 and confined in the openings 365 defined by the partition 361. Each of the light emitting members 370 is preferably made of an organic material uniquely emitting light of one color light such as, but not limited to, red, green, and blue. The OLED display displays images by spatially adding the monochromatic color light emitted from the light emitting members 370. Hereinafter, the pixels representing, for example, red, green, and blue light are referred to as red, green, and blue pixels and are denoted by R, G, and B.

Each of the light emitting members 370 may have a multilayered structure including an emitting layer (not shown) for emitting light and auxiliary layers (not shown) for improving the efficiency of light emission of the emitting layer. The auxiliary layers may include an electron transport layer (not shown) and a hole transport layer (not shown) for improving the balance of the electrons and holes, and an electron injecting layer (not shown) and a hole injecting layer (not shown) for improving the injection of the electrons and holes.

A common electrode 270 is formed on the light emitting members 370 and the partition 361. The common electrode 270 is supplied with the common voltage Vss and is preferably made of a reflective metal such as Ca, Ba, Mg, Al, Ag, etc., or a transparent material such as ITO and IZO. Another layer 390 may be formed on the common electrode 270 to protect the common electrode 270.

In the above-described OLED display, a first control electrode 124a connected to a gate line 121, a first input electrode 173a connected to a data line 171, and a first output electrode 175a along with a semiconductor island 154a form a switching thin film transistor ("TFT") Qs having a channel formed in the semiconductor island 154a disposed between the first input electrode 173a and the first output electrode 175a. Likewise, a second control electrode 124b connected to the first output electrode 175a, a second input electrode 173b connected to a driving voltage line 172, and a second output electrode 175b connected to a pixel electrode 191 along with a semiconductor island 154b form a driving TFT Qd having a channel formed in the semiconductor island 154b disposed between the second input electrode 173b and the second output electrode 175b and including the width W and the length L. In the embodiments described herein, the width W represents a first dimension measured from a first end of the second input and output electrodes 173b and 175b to a second end of the second input and output electrodes 173b and 175b. While this first dimension is measured from the first to second ends as indicated by the arrows in FIG. 3, the actual distance from the first to second ends within the channel may be greater than a linear distance from the first to second ends due to the protrusions which increase a distance of the path from the first end to the second end. The length L in these embodiments represents a second dimension measuring a maximum distance from a facing side of the second input electrode 173b to a facing side of the second output electrode 175b. Here, the boundaries of the protrusions 73a and 75a of the second input and output electrodes 173b and 175b are curved in parallel with the predetermined width such that the width W of the channel of the driving TFT Qd may be maximized.

A pixel electrode 191, a light emitting member 370, and the common electrode 270 form an OLED LD having the pixel electrode 191 as an anode and the common electrode 270 as a cathode, or vice versa. The overlapping portions of the storage electrode 127 and the driving voltage line 172 form a storage capacitor Cst.

The OLED display emits light toward the top or bottom of the substrate 110 to display images. A combination of opaque pixel electrodes 191 and a transparent common electrode 270 is employed in a top emission OLED display that emits light toward the top of the display, and a combination of transparent pixel electrodes 191 and an opaque common electrode 270 is employed in a bottom emission OLED display that emits light toward the bottom of the substrate 110.

The semiconductor members 154a and 154b, if made of polysilicon, may include intrinsic regions (not shown) disposed under the gate electrodes 124a and 124b and extrinsic regions (not shown) disposed opposite each other with respect to the intrinsic regions. The extrinsic regions are electrically connected to the input electrodes 173a and 173b and the output electrodes 175a and 175b, and in such an embodiment the ohmic contacts 163a, 163b, 165a, and 165b may be omitted.

While a particular arrangement of the layers for forming the switching transistor Qs and the driving transistor Qd has been described, alternate arrangements are also within the scope of these embodiments. For example, the gate electrodes 124a and 124b may be disposed over the semiconductor members 154a and 154b, while the gate insulating layer 140 is still interposed between the semiconductor members 154a and 154b and the gate electrodes 124a and 124b. At this time, the data conductors 171, 172, 173b, and 175b may be disposed on the gate insulating layer 140 and electrically connected to the semiconductor members 154a and 154b through the contact holes (not shown) in the gate insulating layer 140. Otherwise, the data conductors 171, 172, 173b, and 175b may be disposed under the semiconductor members 151 and 154b and may electrically contact the semiconductor members 151 and 154b.

Now, an exemplary method of manufacturing the exemplary display panel shown in FIGS. 2 to 5 is described with reference to FIGS. 6 to 17 as well as FIGS. 2 to 5.

Figure 6:
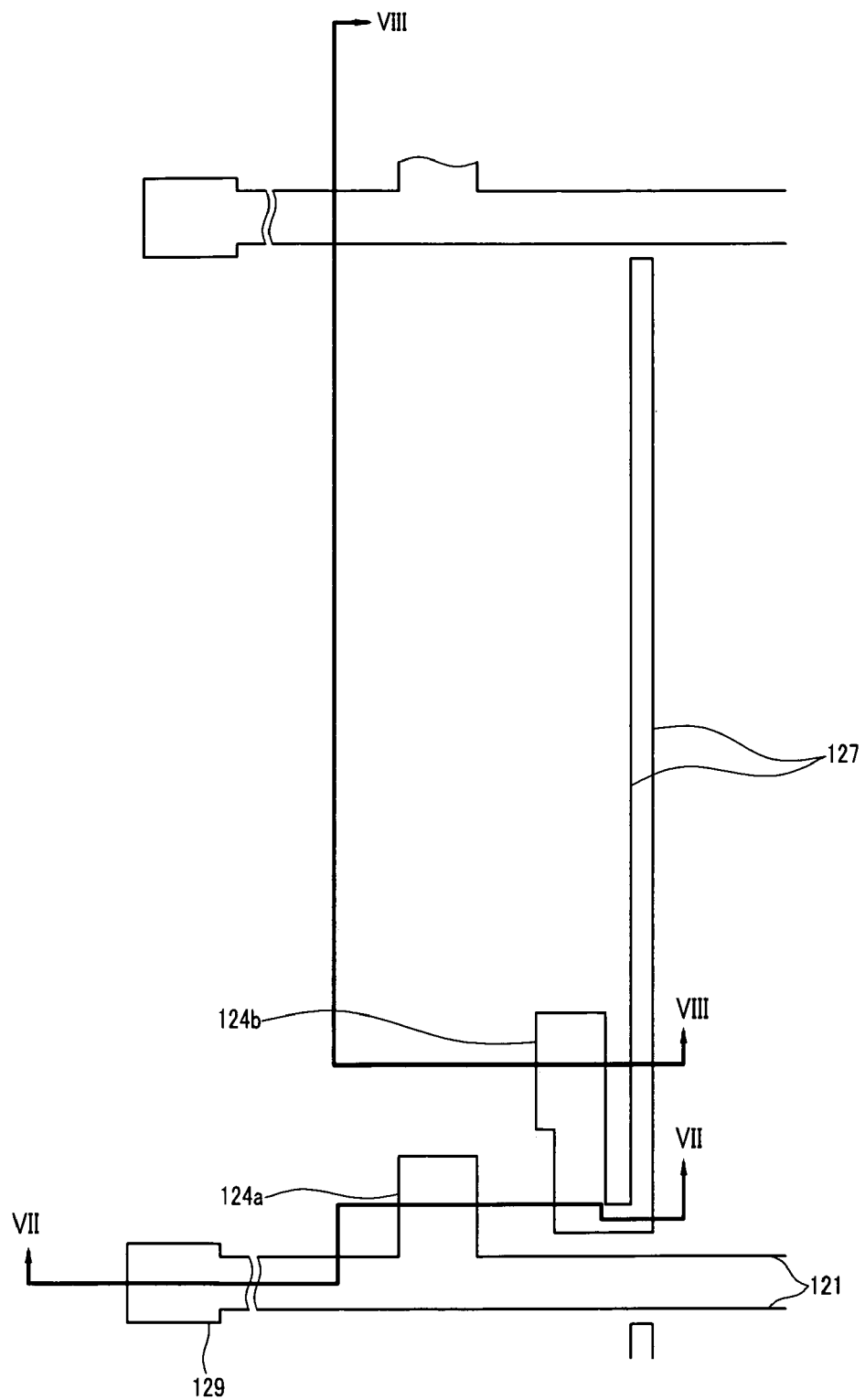
FIGS. 6, 9, 12, and 15 are layout views of the exemplary display panel shown in FIGS. 2 to 5 in intermediate steps of an exemplary manufacturing method thereof according to an exemplary embodiment of the present invention.
Figure 7:
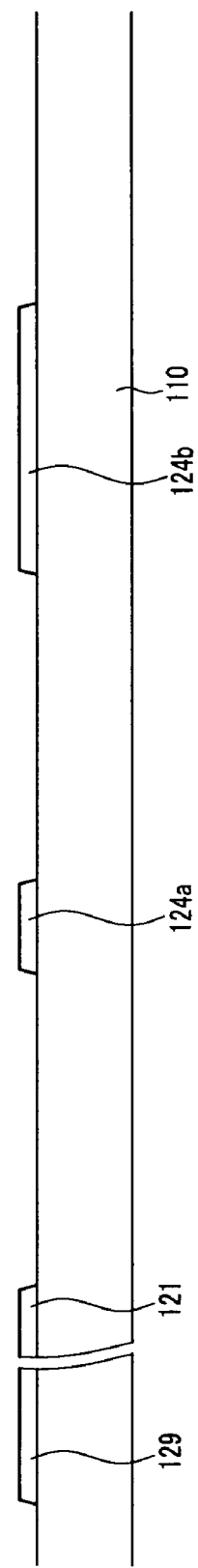
FIGS. 7 and 8 are sectional views of the exemplary display panel shown in FIG. 6 taken along lines VII-VII and VIII-VIII, respectively.
Figure 8:
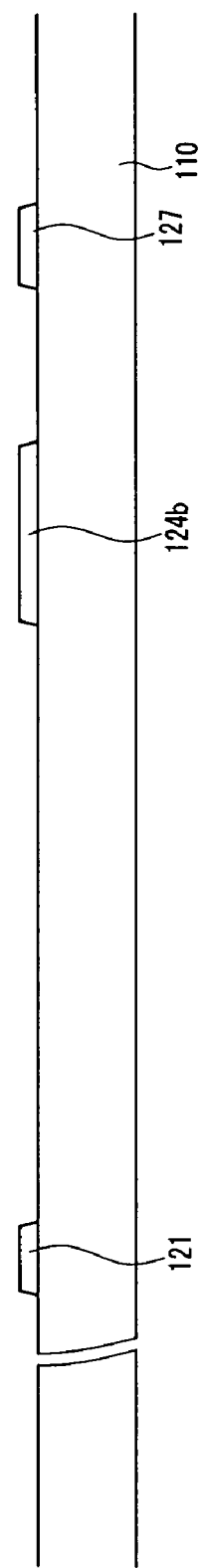
Figure 9:
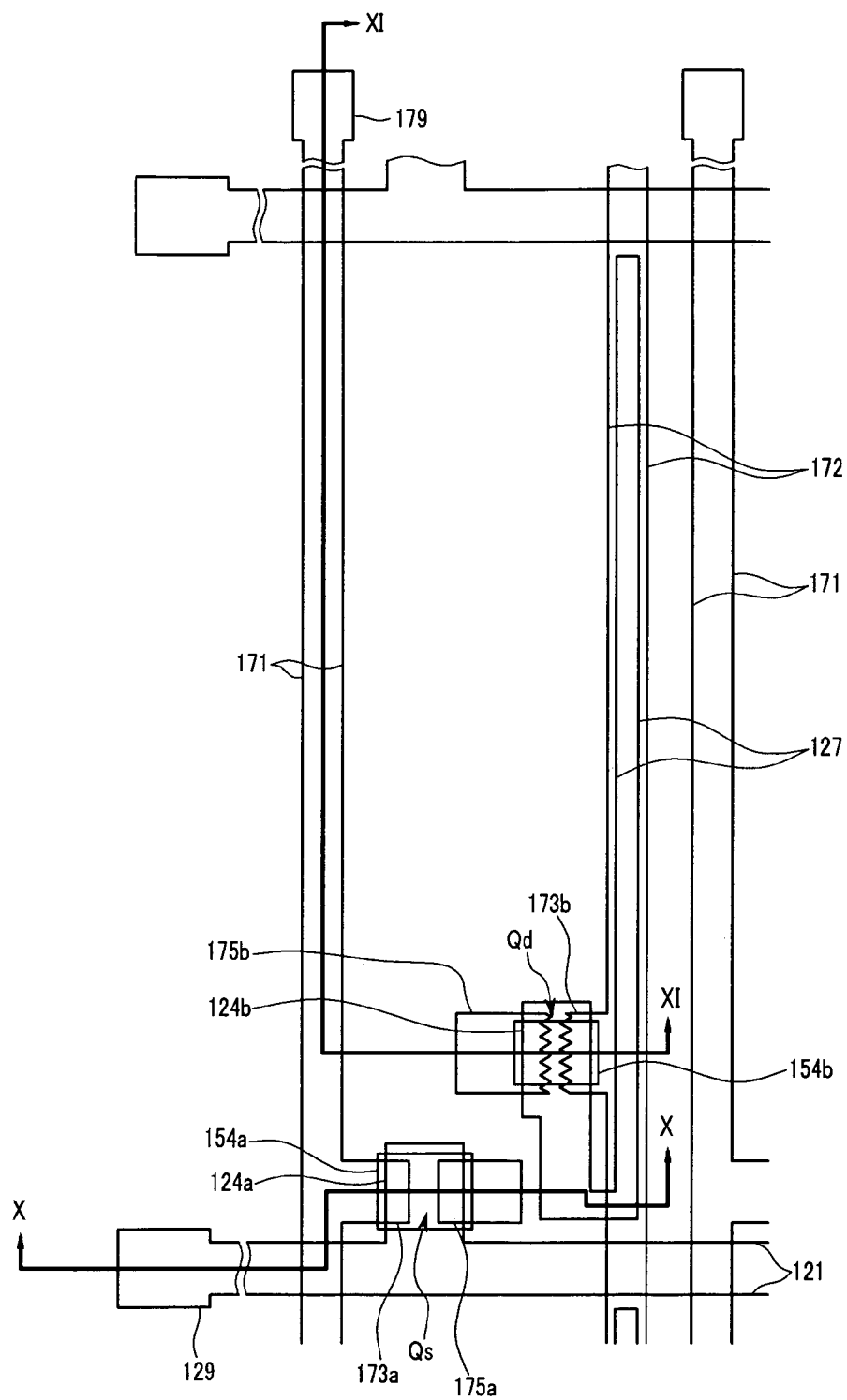
Figure 10:
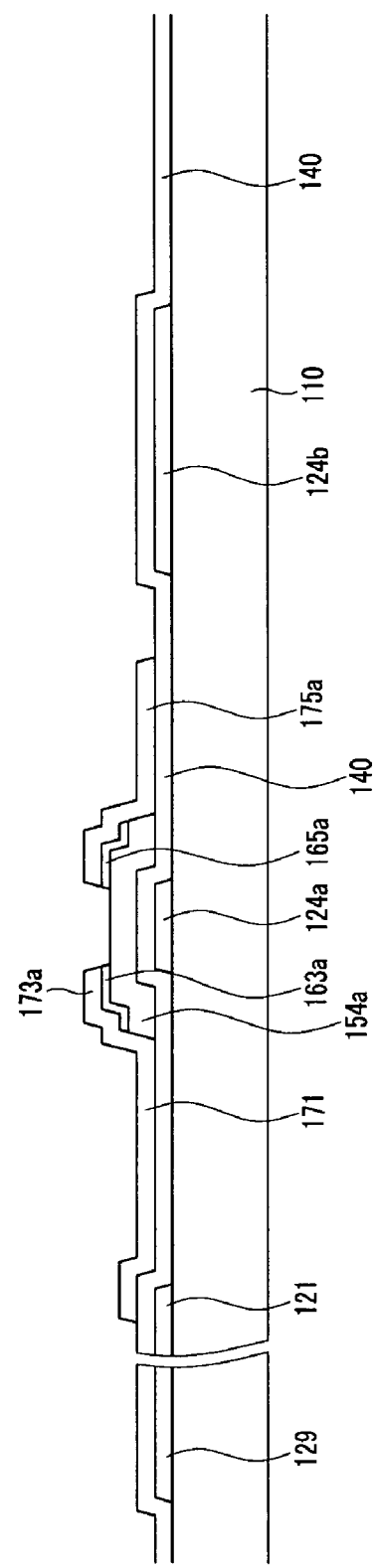
FIGS. 10 and 11 are sectional views of the exemplary display panel shown in FIG. 9 taken along lines X-X and XI-XI, respectively.
Figure 11:
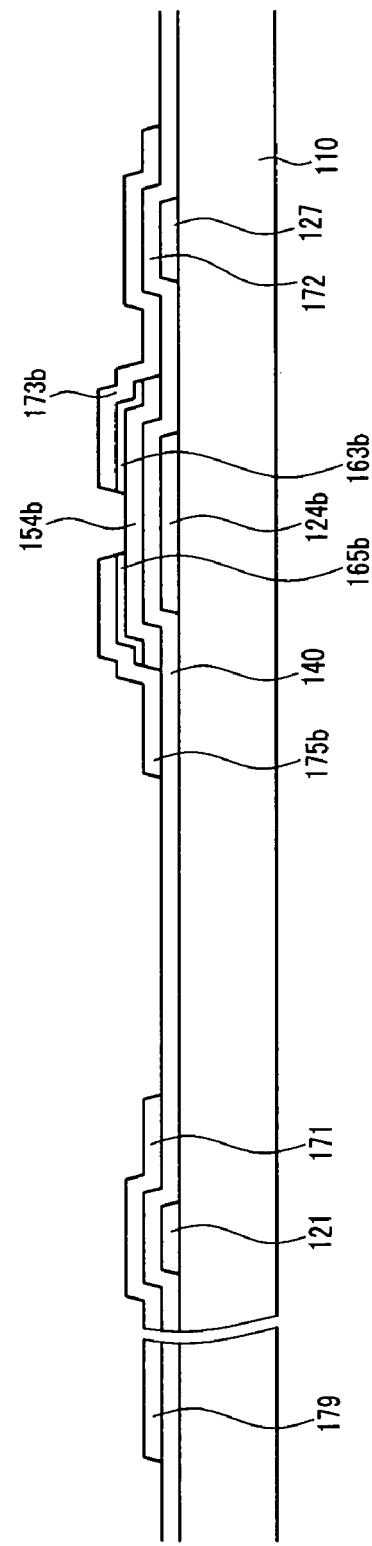
Figure 12:
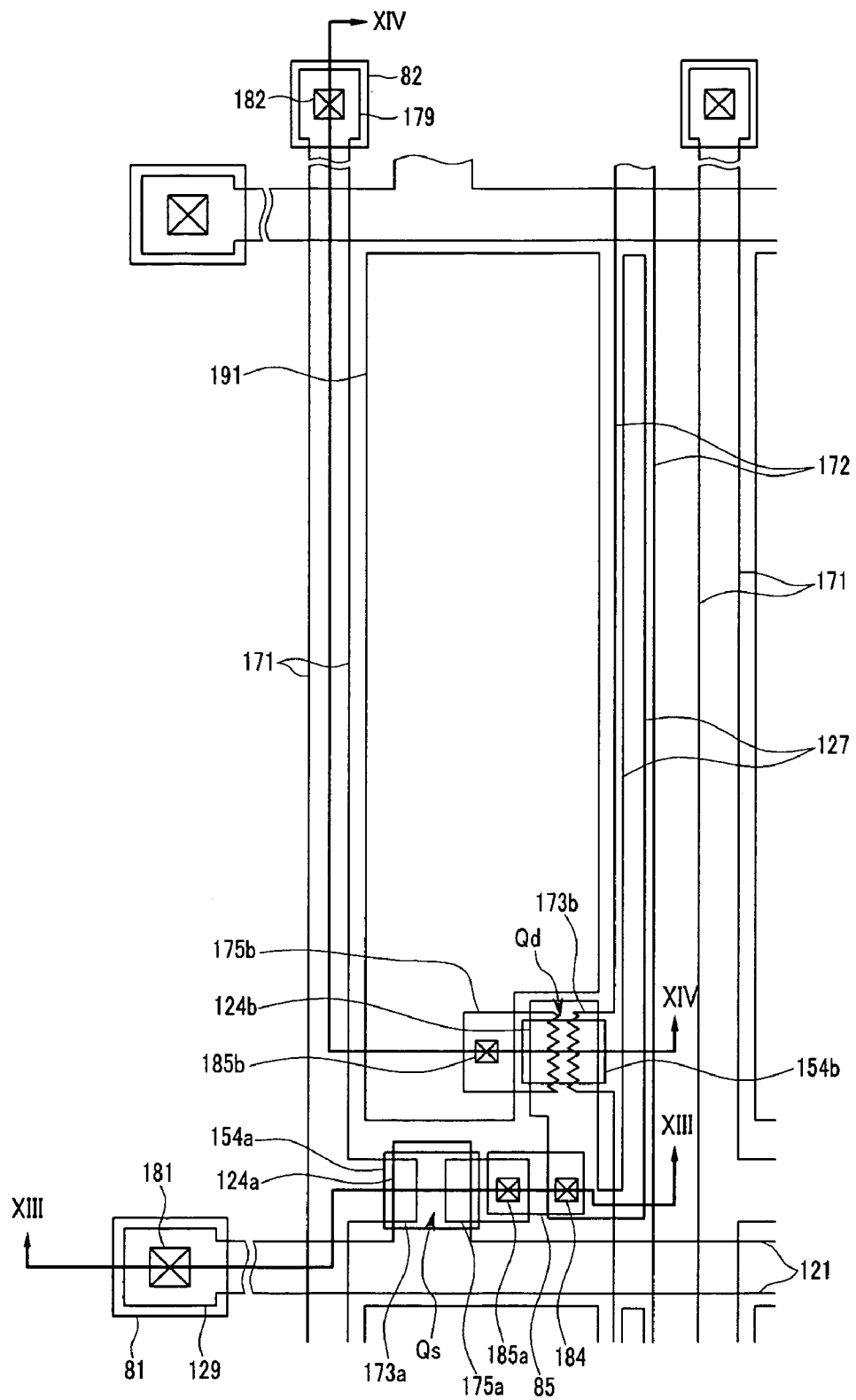
Figure 13:
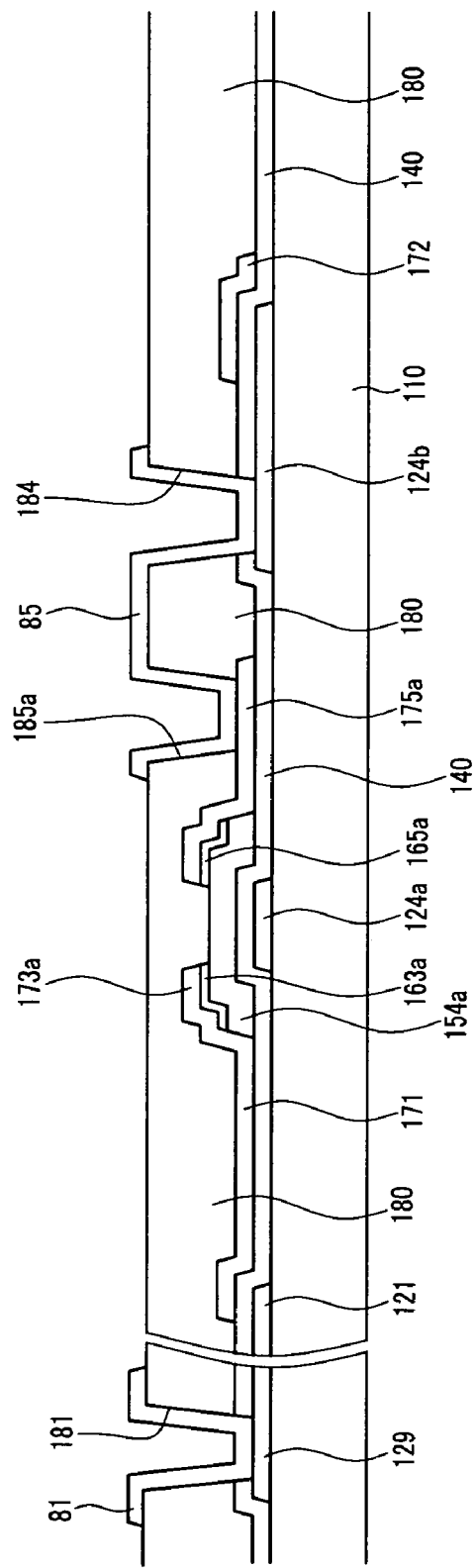
FIGS. 13 and 14 are sectional views of the exemplary display panel shown in FIG. 12 taken along lines XIII-XIII and XIV-XIV, respectively.
Figure 14:
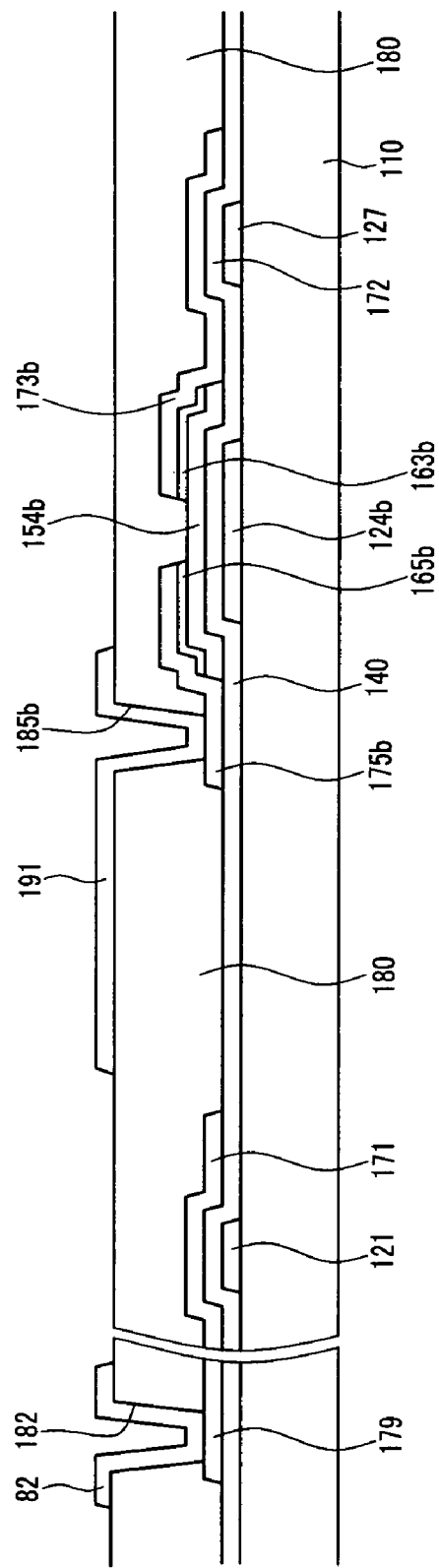
Figure 15:
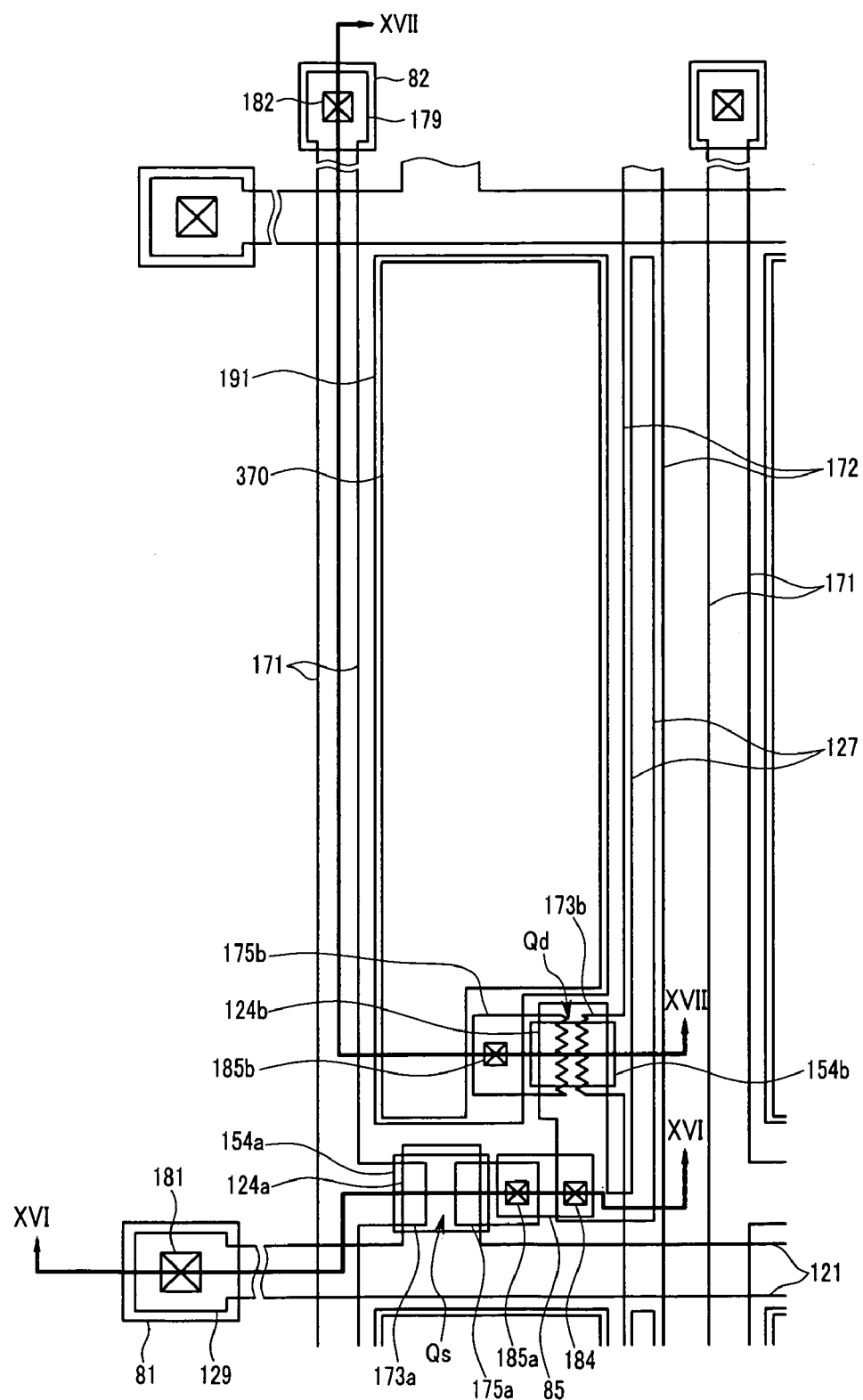
Figure 16:
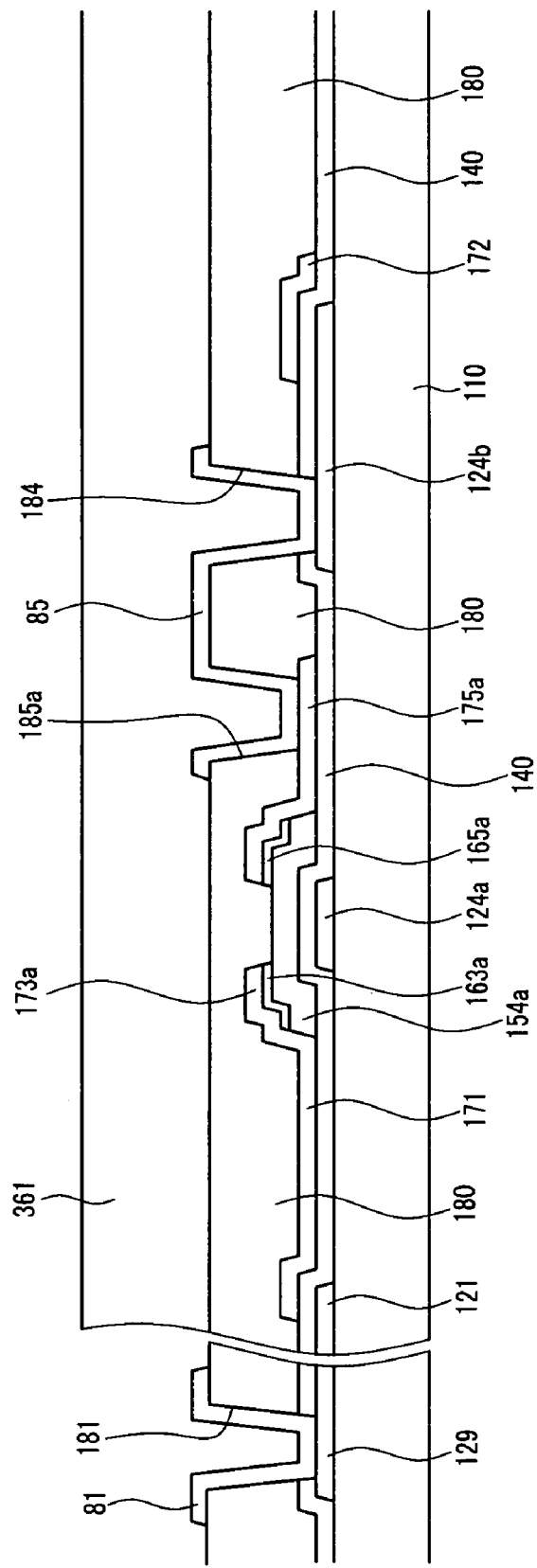
FIGS. 16 and 17 are sectional views of the exemplary display panel shown in FIG. 15 taken along lines XVI-XVI and XVII-XVII, respectively.
Figure 17:
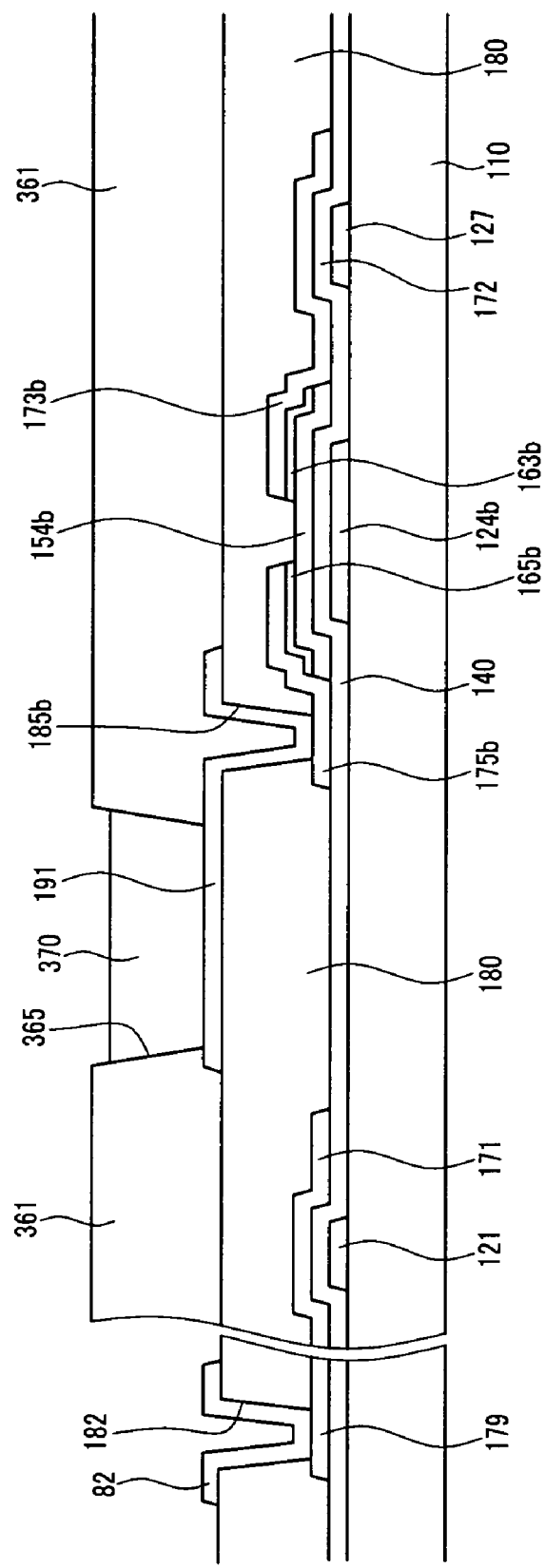

FIGS. 6, 9, 12, and 15 are layout views of the exemplary display panel shown in FIGS. 2 to 5 in intermediate steps of an exemplary manufacturing method thereof according to an exemplary embodiment of the present invention, FIGS. 7 and 8 are sectional views of the exemplary display panel shown in FIG. 6 taken along lines VII-VII and VIII-VIII, respectively, FIGS. 10 and 11 are sectional views of the exemplary display panel shown in FIG. 9 taken along lines X-X and XI-XI, respectively, FIGS. 13 and 14 are sectional views of the exemplary display panel shown in FIG. 12 taken along the lines XIII-XIII and XIV-XIV, respectively, and FIGS. 16 and 17 are sectional views of the exemplary display panel shown in FIG. 15 taken along lines XVI-XVI and XVII-XVII, respectively.

A plurality of gate conductors that include a plurality of gate lines 121 including first control electrodes 124a and plurality of end portions 129, and a plurality of second control electrodes 124b including a plurality of storage electrodes 127, are formed on an insulating substrate 110 made of a material such as transparent glass or plastic.

Referring to FIGS. 9 to 11, after sequential deposition of a gate insulating layer 140, an intrinsic a-Si layer, and an extrinsic a-Si layer using chemical vapor deposition ("CVD"), the extrinsic a-Si layer and the intrinsic a-Si layer are photo-etched to form a plurality of extrinsic semiconductor islands (not shown) and a plurality of intrinsic semiconductor islands 154a and 154b on the gate insulating layer 140.

Next, a conductive layer is sputtered or deposited by CVD over the semiconductor islands 154a and 154b and the gate insulating layer 140 and photo-etched to form a plurality of data conductors that includes a plurality of data lines 171 including a plurality of first input electrodes 173a and a plurality of end portions 179, a plurality of driving voltage lines 172 including second input electrodes 173b, and a plurality of first and second output electrodes 175a and 175b.

With reference to FIG. 3, here, the skew phenomenon is severely generated on the peaks H of the protrusions 73a and 75a of the second input and output electrodes 173b and 175b, but the skew phenomenon is hardly generated on the gullies G.

Because the contact area is wider on the peaks H, the etch amount of the conductive layer is large, and because the contact area is narrower in the gullies G, the etch amount of the conductive layer is small. Also, because it is difficult for the photoresist pattern corresponding to the gullies G to be the same shape as the gullies G, and the photoresist pattern is left in the gullies G, the conductive layer including the gullies G is not over-etched.

Accordingly, this shape prevents the length L of the channel from extending by the skew phenomenon, and the width W of the channel may be maximized.

The exposed portions of the extrinsic semiconductor islands, which are not covered with the data conductors 171, 172, 175a, and 175b, are removed by etching to complete a plurality of ohmic contact islands 163a, 163b, 165a, and 165b and to expose portions of the intrinsic semiconductor islands 154a and 154b. Oxygen plasma treatment may follow thereafter in order to stabilize the exposed surfaces of the semiconductor islands 154a and 154b.

Referring to FIGS. 12 to 14, a passivation layer 180 is deposited by CVD or printing, etc., and patterned along with the gate insulating layer 140 to form a plurality of contact holes 181, 182, 184, 185a, and 185b exposing portions of the first output electrodes 175a and the second control electrodes 124b, the second output electrodes 175b, and the end portions 129 and 179 of the gate lines 121 and the data lines 171.

Next, a transparent conductive film is deposited on the passivation layer 180 by sputtering, etc., and it is photo-etched to form a plurality of pixel electrodes 191, a plurality of connecting members 85, and a plurality of contact assistants 81 and 82. Alternatively, an opaque conductive film may be deposited on the passivation layer 180 for a top emission OLED display.

Referring to FIGS. 15 to 17, a photosensitive organic insulator is spin-coated, and exposed and developed to form a partition 361 having openings 365 partly exposing the pixel electrodes 191.

Next, a plurality of organic light emitting members 370 including an electron transport layer, a hole transport layer, and an emitting layer are formed on the pixel electrodes 191 in the openings 365. The organic light emitting members 370 may be formed by a solution process such as inkjet printing and evaporation, and it is preferable that an inkjet head be used to deposit the solvent in the openings 365 in the inkjet printing and the drying process may follow formation of each layer.

Next, as shown in FIGS. 2 to 6, a common electrode 270 is formed on the organic light emitting members 370 and the partition 361.

In the meantime, the shape of the channel over the exposed surface of the semiconductor island 154b determined by the shapes of the second input and output electrodes 173b and 175b, which face each other, may vary.

FIGS. 18 to 26 are schematic plan views respectively showing the exemplary channels in an exemplary OLED according to various exemplary embodiments of the present invention.

Figure 18:
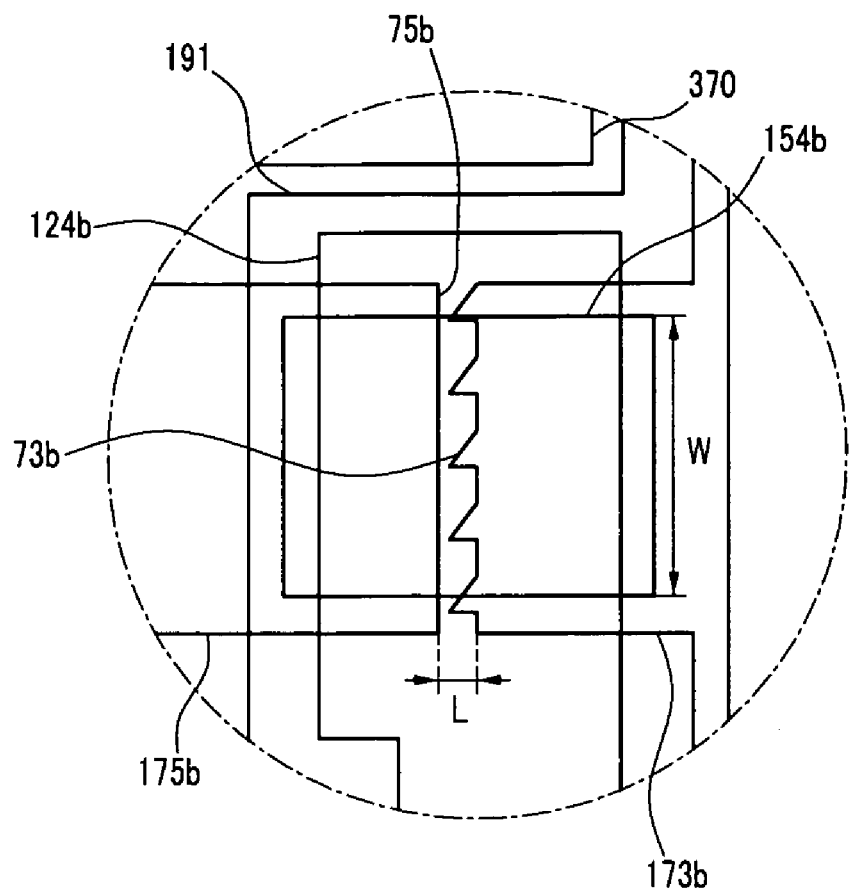
FIGS. 18 to 26 are schematic plan views respectively showing the exemplary channels in an exemplary OLED according to various exemplary embodiments of the present invention.

Referring to FIG. 18, the side of the second input electrode 173b facing the second output electrode 175b includes a plurality of protrusions 73b with the shape of a right triangle, and the side of the second output electrode 175b that faces the second input electrode 173b has a side 75b of a straight line. Here, the width W of the channel of a driving TFT Qd may be extended through the protrusions 73b of the second input electrode 173b.

Figure 19:
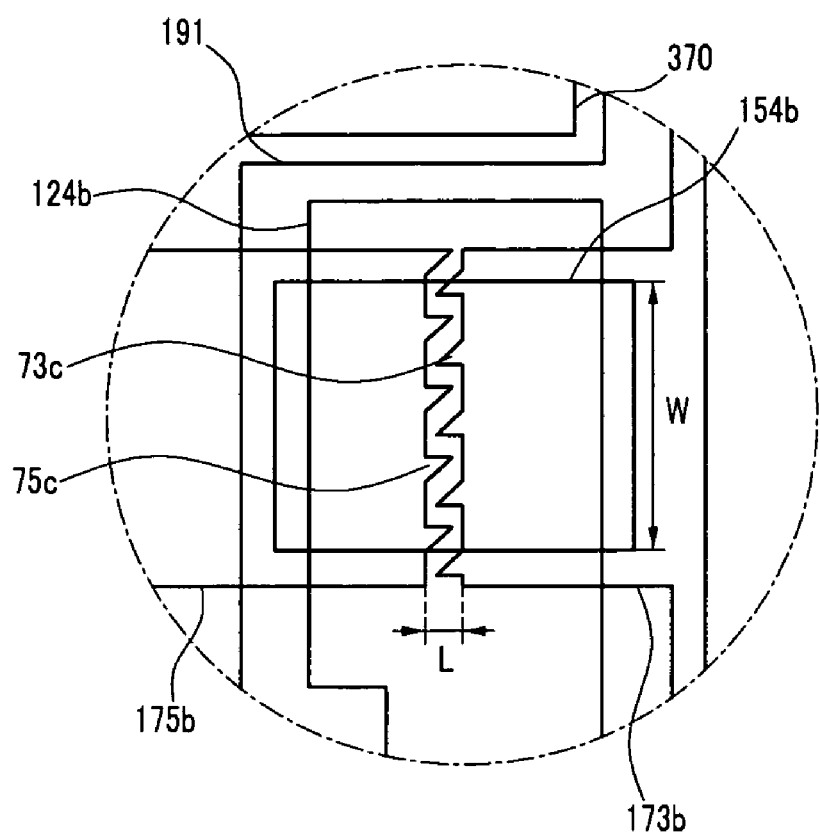

Referring to FIG. 19, the side of the second input electrode 173b facing the second output electrode 175b includes a plurality of protrusions 73c with the shape of a right triangle, and the side of the second output electrodes 175b that faces the second input electrode 173b also has a plurality of protrusions 75c with the shape of a right triangle. The protrusions 73c and 75c are alternately disposed, and their oblique sides that face each other are parallel to each other. Also, straight sides of the protrusions 73c and 75c face each other and are parallel to each other as well.

Figure 20:
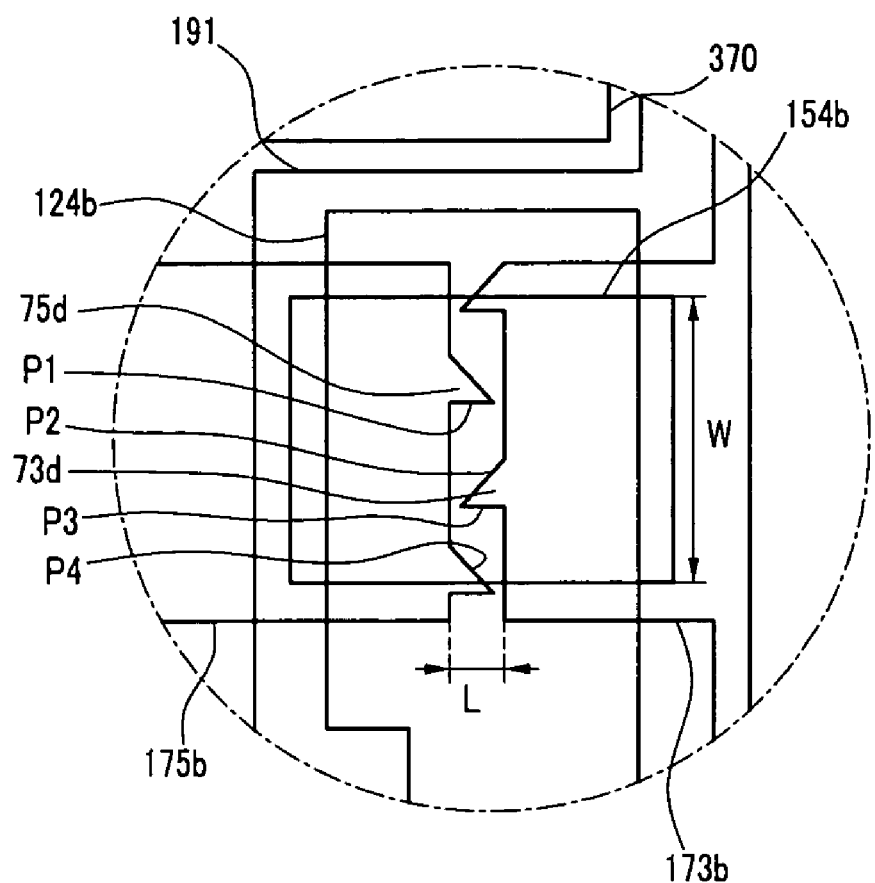

Referring to FIG. 20, the side of the second input electrode 173b facing the second output electrode 175b includes a plurality of protrusions 73d with the shape of a right triangle, and the side of the second output electrode 175b that faces the second input electrode 173b also has a plurality of protrusions 75d with the shape of a right triangle. The protrusions 73d and 75d are alternately disposed. The oblique side P2 of the protrusions 73d face the right side P1 of the protrusions 75d, and the right side P3 of the protrusions 73d face the oblique side P4 of the protrusions 75d.

Figure 21:
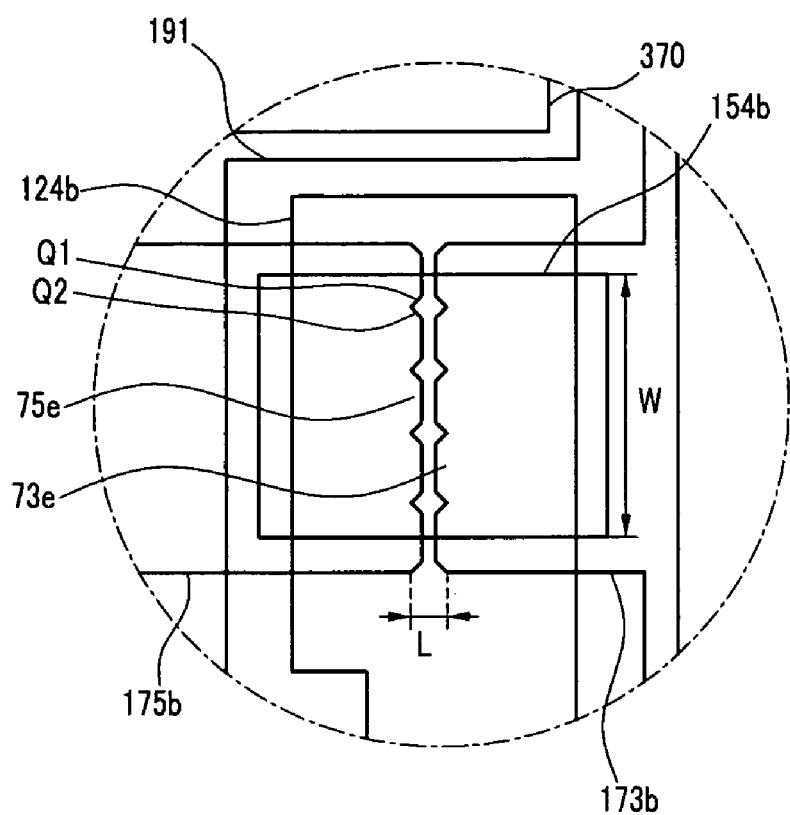

Referring to FIG. 21, the side of the second input electrode 173b facing the second output electrode 175b includes a plurality of protrusions 73e with a trapezoidal shape, and the side of the second output electrode 175b that faces the second input electrode 173b also has a plurality of protrusions 75e with a trapezoidal shape. The oblique sides Q1 and Q2 of neighboring protrusions 73e and neighboring protrusions 75e are directly connected to each other and the protrusions 73e and 75e are disposed at the same positions such that the protrusions 73e and 75e are bisymmetrical with respect to the center line of the channel between the second input and output electrodes 173b and 175b.

Figure 22:
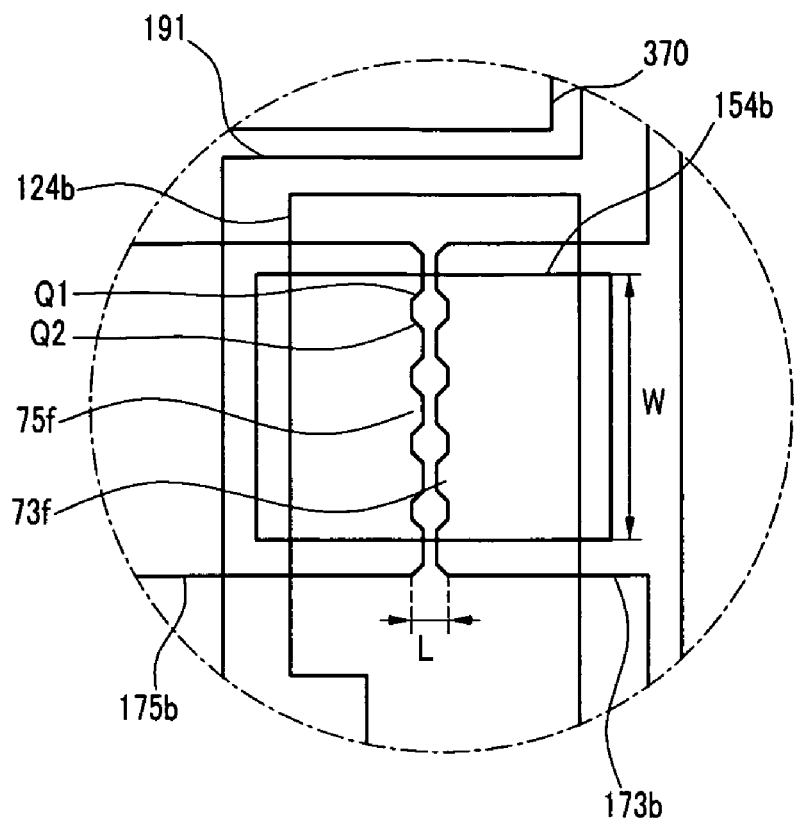

Referring to FIG. 22, the side of the second input electrode 173b facing the second output electrode 175b includes a plurality of protrusions 73f with a trapezoidal shape, and the side of the second output electrode 175b that faces the second input electrodes 173b also has a plurality of protrusions 75f with a trapezoidal shape. The oblique sides Q1 and Q2 of neighboring protrusions 73f and neighboring protrusions 75f are disposed with a predetermined interval there between and are connected to each other with a straight edge portion or the like of the opposing sides of the second input and output electrodes 173b and 175b. The protrusions 73f and 75f are disposed at the same positions such that the protrusions 73f and 75f are bisymmetrical with respect to the center line of the channel between the second input and output electrodes 173b and 175b.

Figure 23:
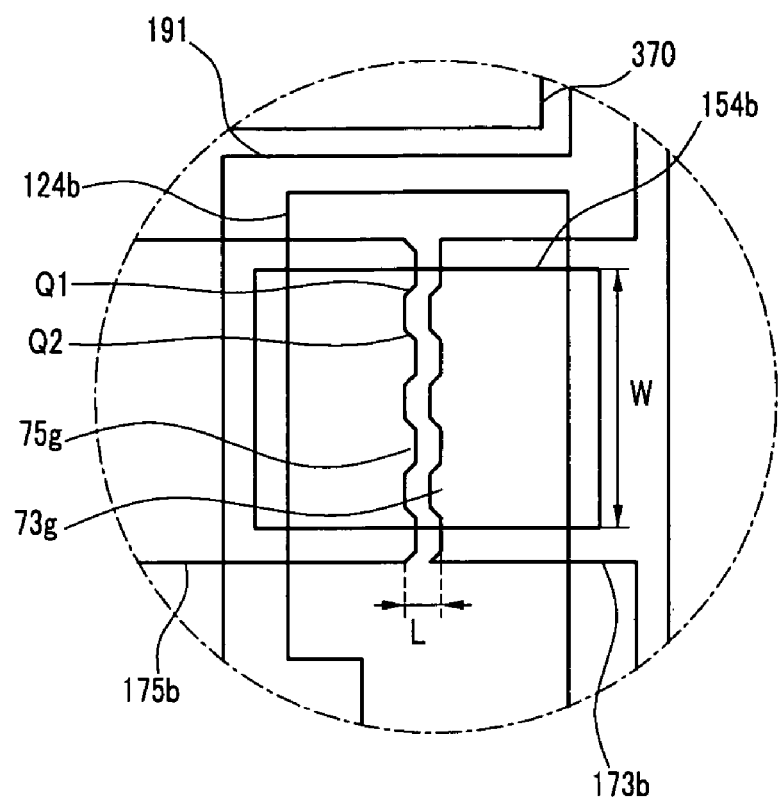

Referring to FIG. 23, the side of the second input electrode 173b facing the second output electrode 175b includes a plurality of protrusions 73g with a trapezoidal shape, and the side of the second output electrode 175b that faces the second input electrodes 173b also has a plurality of protrusions 75g with a trapezoidal shape. The oblique sides Q1 and Q2 of neighboring protrusions 73g and neighboring protrusions 75g are disposed with a predetermined interval there between and are connected to each other with a straight edge portion or the like of the opposing sides of the second input and output electrodes 173b and 175b. The protrusions 73g and 75g of the second input and output electrode 173b and 175b are offset such that the protrusions 73g and 75g are positioned in a nested relationship to each other, but spaced apart to maintain the channel there between.

Figure 24:
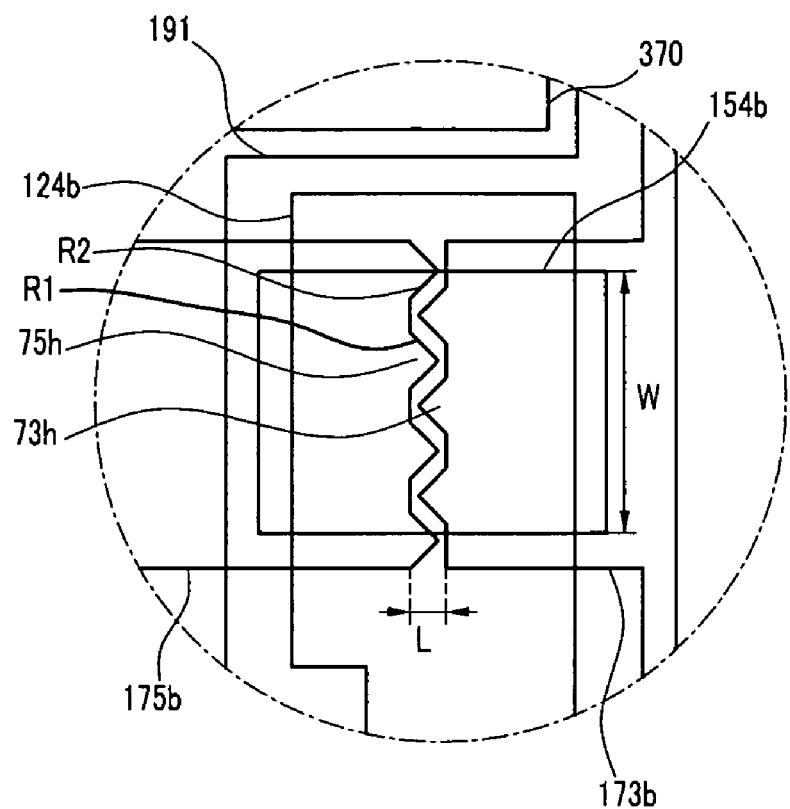

Referring to FIG. 24, the side of the second input electrode 173b facing the second output electrode 175b includes a plurality of protrusions 73h with a triangular shape, and the side of the second output electrode 175b that faces the second input electrode 173b also has a plurality of protrusions 75h with a triangular shape. The oblique sides R1 and R2 of neighboring protrusions 73h and neighboring protrusions 75h are disposed with a predetermined interval there between and are connected to each other such as with a straight edge portion of the opposing sides of the second input and output electrodes 173b and 175b. The protrusions 73h and 75h of the second input and output electrodes 173b and 175b are offset such that the protrusions 73h and 75h point to connecting portions between adjacent protrusions 73h and adjacent protrusions 75h. Here, the sizes of the protrusions 73h and 75h of the second input and output electrode 173b and 175b are the same, or substantially the same.

Figure 25:
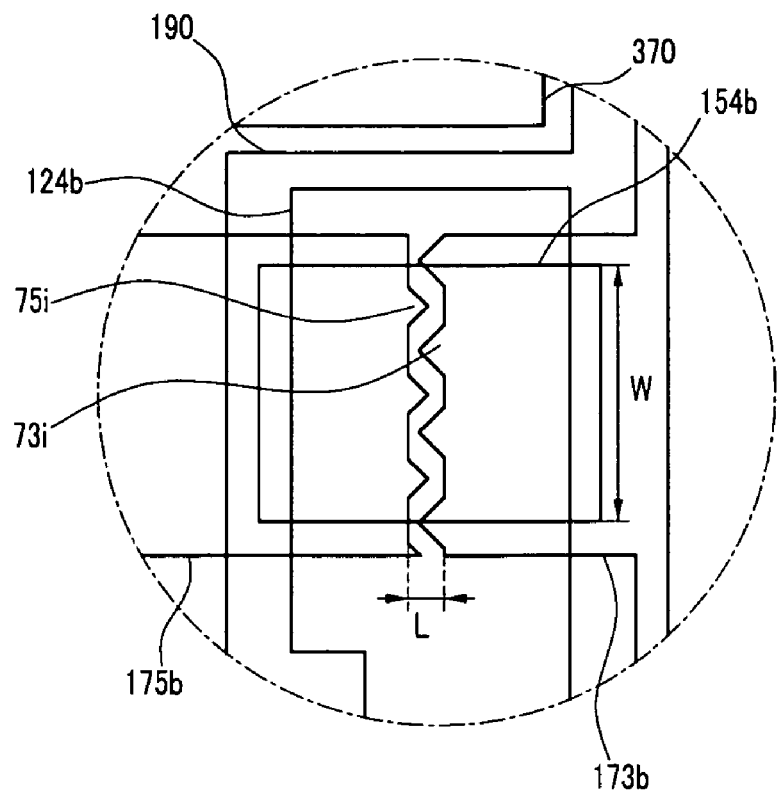

Referring to FIG. 25, the shapes and arrangements of the protrusions 73i and 75i of the second input and output electrodes 173b and 175b are substantially the same as those of FIG. 24. However, the sizes of the protrusions 73i and 75i of the second input and output electrodes 173b and 175b are different from each other. For example, the protrusions 73*i* may be larger or smaller than the protrusions 75*i*.

Figure 26:
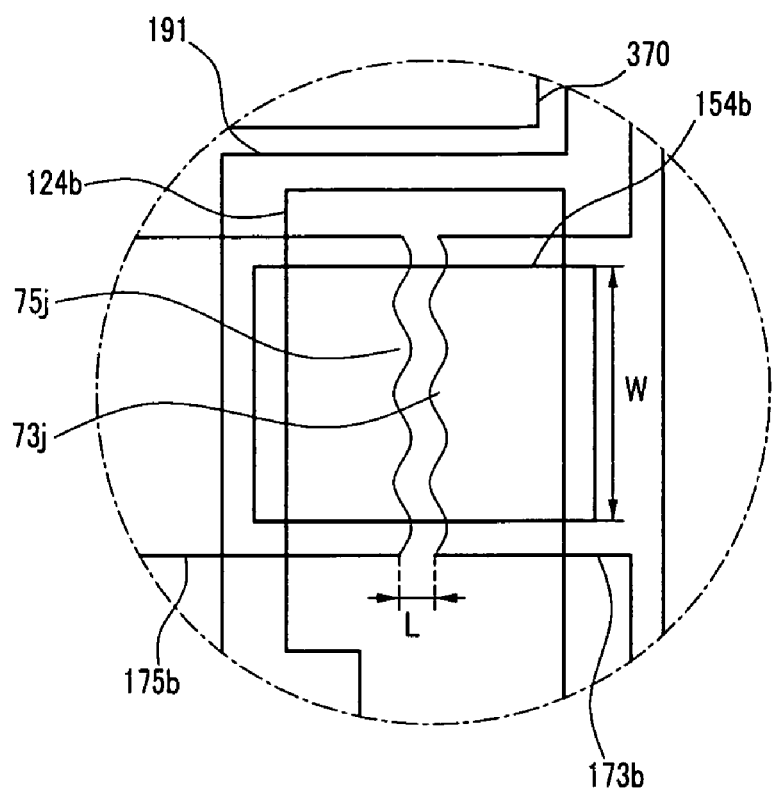

Referring to FIG. 26, the side of the second input electrode 173*b* facing the second output electrode 175*b* includes a plurality of protrusions 73*j* with a semicircular shape, and the side of the second output electrode 175*b* that faces the second input electrode 173*b* also has a plurality of protrusions 75*j* with a semicircular shape. Neighboring protrusions 73*j* and neighboring protrusions 75*j* may be connected to each other be semicircular indentations. The protrusions 73*j* and 75*j* of the second input and output electrodes 173*b* and 175*b* are offset such that the protrusions 73*j* and 75*j* are positioned in a nested relationship with respect to each other. In other words, the protrusions 73*j* face the connecting portions of the neighboring protrusions 75*j*, and the protrusions 75*j* face the connecting portions of the neighboring protrusions 73*j*.

Figure 27:
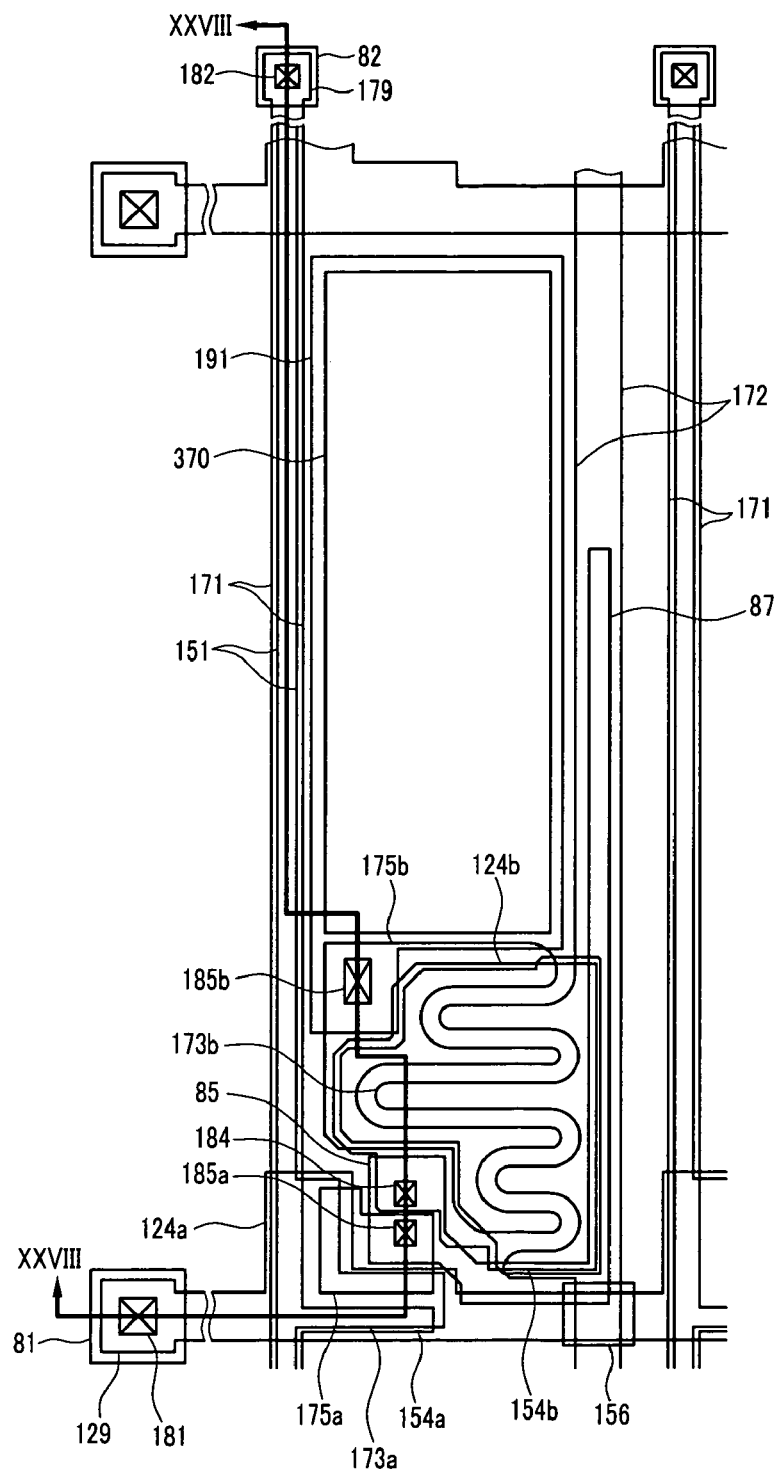
FIG. 27 is a schematic plan view of a portion of an exemplary OLED according to another exemplary embodiment of the present invention.
Figure 28:
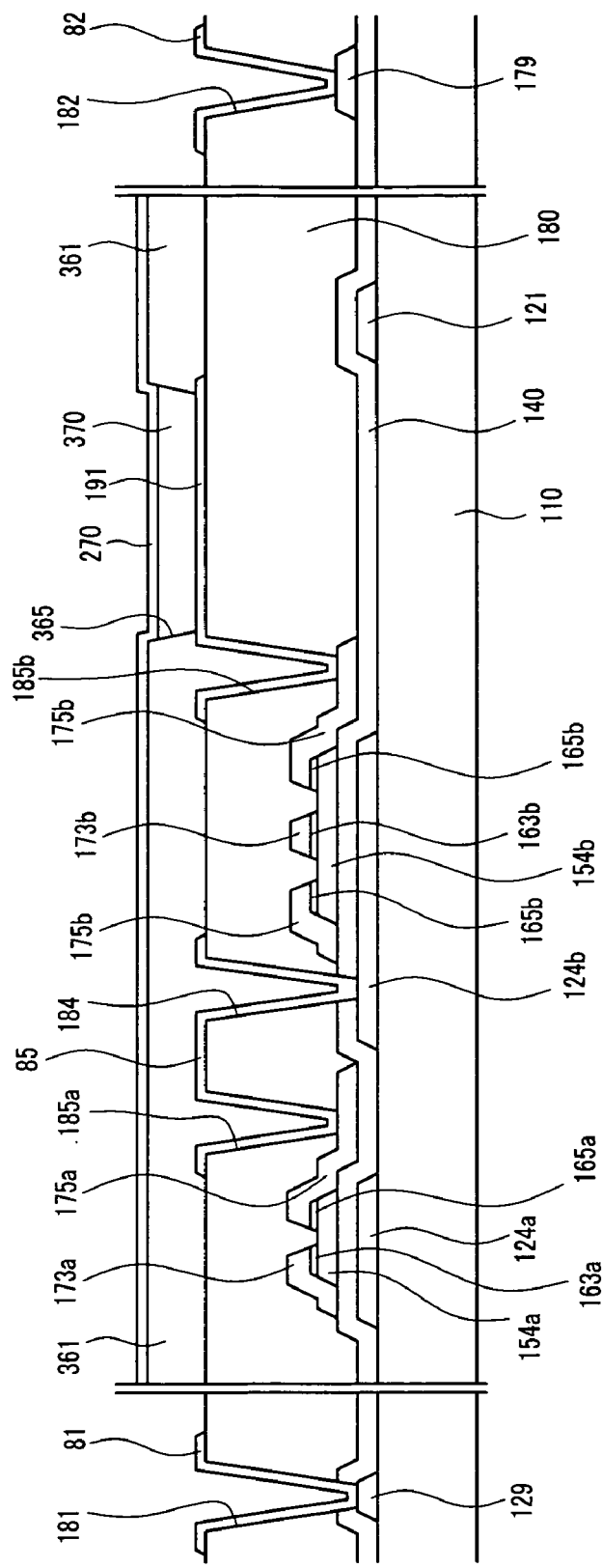
FIG. 28 is a sectional view of the exemplary OLED shown in FIG. 27 taken along line XXVIII-XXVIII.

FIG. 27 is a schematic plan view of an exemplary OLED according to another exemplary embodiment of the present invention, and FIG. 28 is a sectional view of the exemplary OLED shown in FIG. 27 taken along line XXVIII-XXVIII.

Layered structures of the OLED according to this exemplary embodiment are almost the same as those shown in FIGS. 4 and 5, with the differences as described below.

A plurality of gate conductors that include a plurality of gate lines 121 including first control electrodes 124*a*, and a plurality of second control electrodes 124*b*, are formed on an insulating substrate 110, a gate insulating layer 140 is formed thereon, and a plurality of semiconductor islands 154*a* and 154*b* and a plurality of ohmic contacts 163*a*, 163*b*, 165*a*, and 165*b* are sequentially formed thereon. A plurality of data conductors including a plurality of data lines 171, a plurality of driving voltage lines 172, and a plurality of first and second output electrodes 175*a* and 175*b* are formed on the ohmic contacts 163*a*, 163*b*, 165*b*, and 165*b* and the gate insulating layer 140, and a passivation layer 180 is formed thereon. The passivation layer 180 has a plurality of contact holes 181, 182, 184, 185*a*, and 185*b*, and a plurality of pixel electrodes 191, a plurality of connecting members 85, and a plurality of contact assistants 81 and 82 are formed on the passivation layer 180. A partition 361 having a plurality of openings 365 and a plurality of light emitting members 370 are formed on the pixel electrodes 191 within the openings 365. A common electrode 270 is formed on the light emitting members 370 and the partition 361.

Unlike the OLED shown in FIGS. 4 and 5, the first input electrode 173*a* includes a portion of the data line 171 overlapping the first control electrode 124*a*, and a portion extended toward the driving voltage line 172 and overlapping the gate line 121. Accordingly, two sides, such as two perpendicular sides, of the first output electrode 175*a* face the two portions of the first input electrode 173*a*.

Also, the size of the second control electrode 124*b* is very large, and the facing sides of the second input and output electrodes 173*b* and 175*b* and the shape of the channel of the driving TFT Qd are different from those of the OLED shown in FIGS. 4 and 5.

The channel that the portion of the semiconductor islands 154*b* exposes between the facing sides of the second input and output electrodes 173*b* and 175*b* has a serpentine shape, such that the width of the channel may be extended. Each of the connecting members 85 includes a storage electrode 87 extending along a driving voltage line 172 to overlap it.

Also, a plurality of additional semiconductor members 156 are formed on the portion of the gate lines 121 intersecting the driving voltage lines 172 to smooth the profile of the surface, thereby preventing the disconnection of the driving voltage lines 172.

Many of the above-described features of the exemplary OLEDs shown in FIGS. 2 to 28 may also be appropriate for a liquid crystal display ("LCD").

Figure 29:
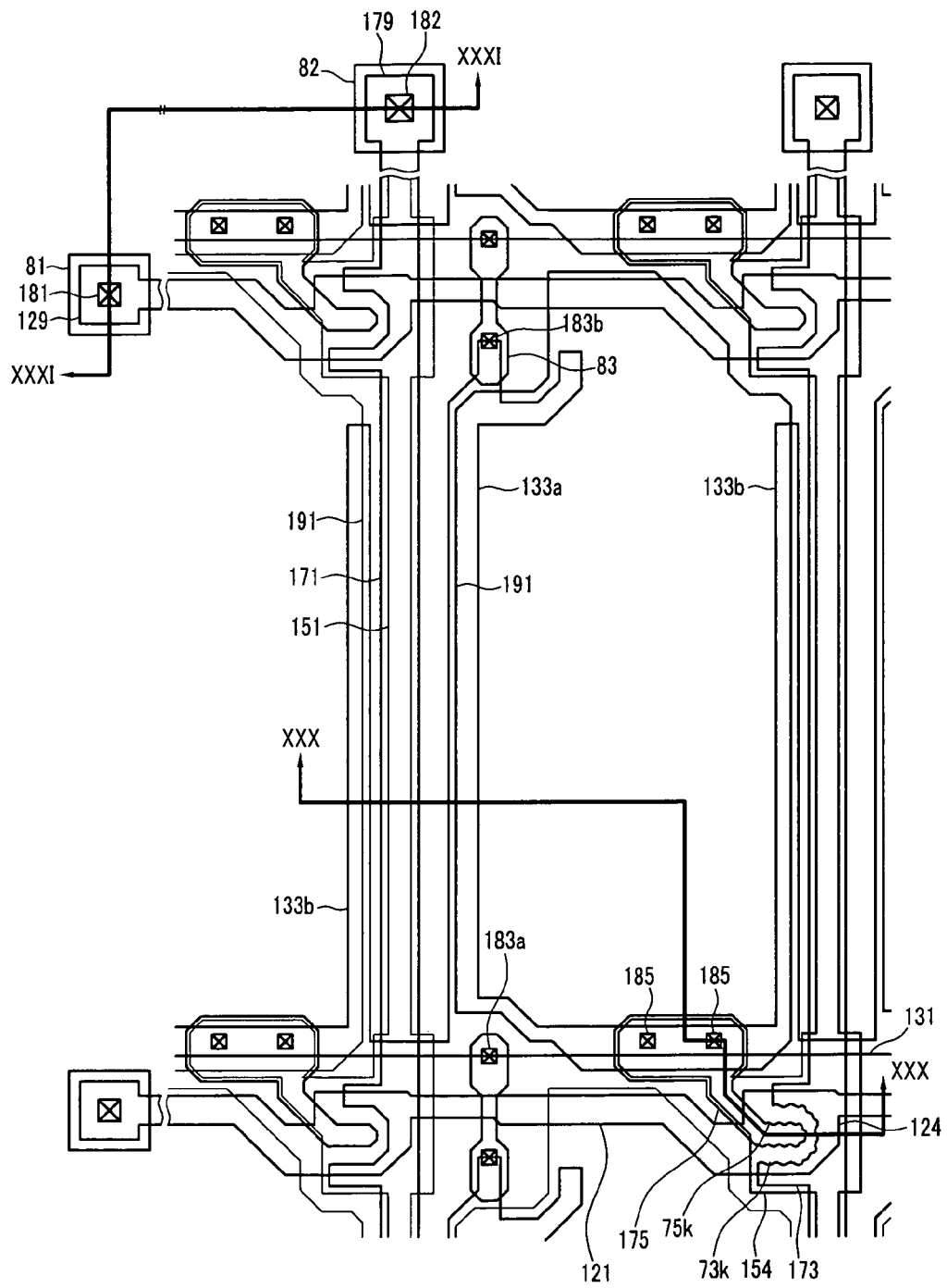
FIG. 29 is a schematic plan view of a portion of an exemplary liquid crystal display ("LCD") according to another exemplary embodiment of the present invention.
Figure 30:
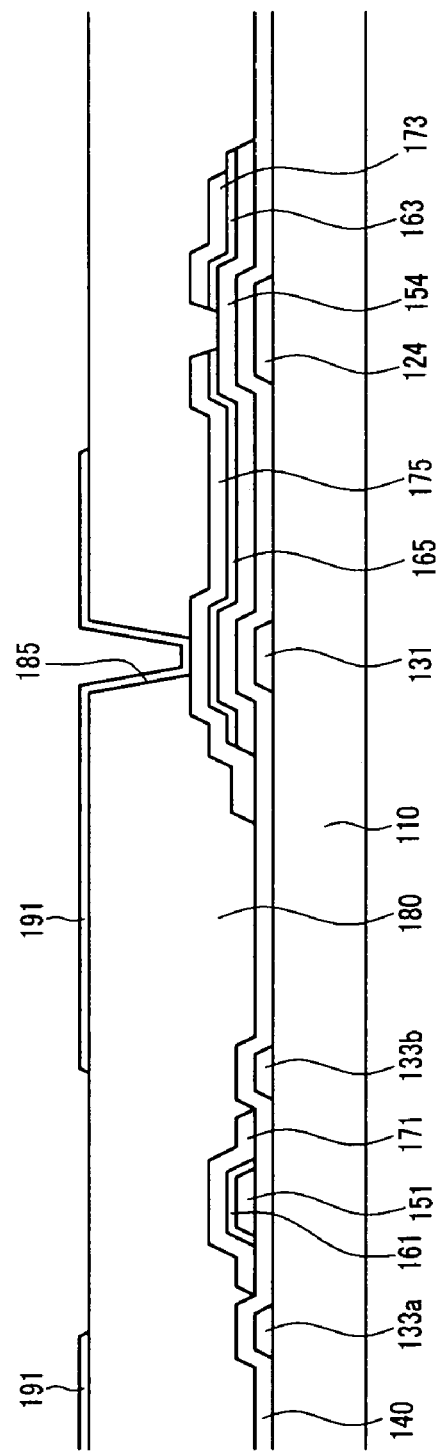
FIGS. 30 and 31 are sectional views of the exemplary LCD shown in FIG. 29 taken along lines XXX-XXX and XXXI-XXXI.
Figure 31:
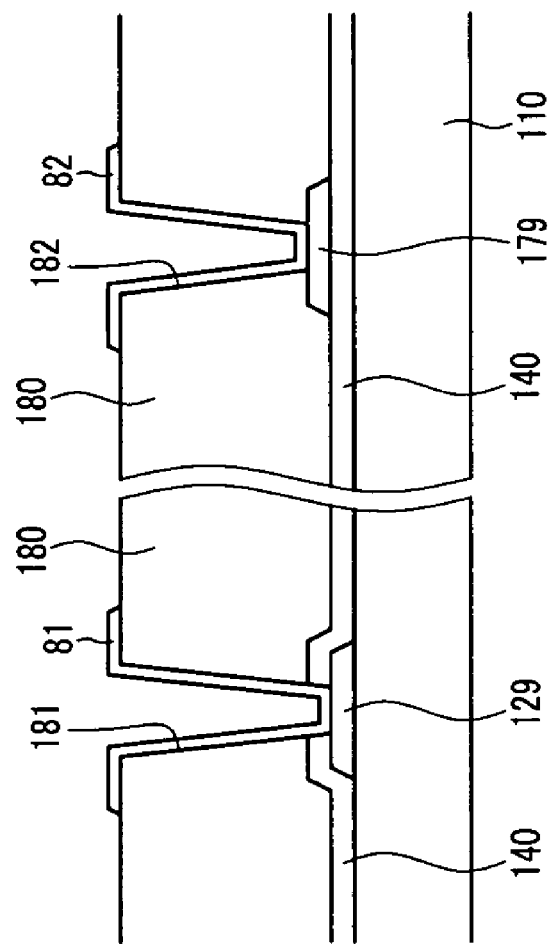

FIG. 29 is a schematic plan view of an exemplary LCD according to another exemplary embodiment of the present invention, and FIGS. 30 and 31 are sectional views of the exemplary LCD shown in FIG. 29 taken along lines XXX-XXX and XXXI-XXXI.

A plurality of gate lines 121 and a plurality of storage electrode lines 131 are formed on an insulating substrate 110 made of a material such as transparent glass or plastic.

The gate lines 121 transmit gate signals and extend substantially in a transverse direction, a first direction. Each of the gate lines 121 includes a plurality of gate electrodes 124 projecting downward, such as towards an adjacent gate line 121, and an end portion 129 having a large area for contact with another layer or an external driving circuit. A gate driving circuit (not shown) for generating the gate signals may be mounted on a flexible printed circuit ("FPC") film (not shown), which may be attached to the substrate 110, directly mounted on the substrate 110, or integrated with the substrate 110. The gate lines 121 may extend to be connected to a driving circuit that may be integrated with the substrate 110.

The storage electrode lines 131 are supplied with a predetermined voltage, and each of the storage electrode lines 131 includes a stem extending substantially parallel to the gate lines 121 and a plurality of pairs of storage electrodes 133*a* and 133*b* branched from the stems. The storage electrodes 133*a* and 133*b* may extend substantially in a direction perpendicular to the stems of the storage electrode lines 131. Each of the storage electrode lines 131 is disposed between two adjacent gate lines 121, and a stem of each storage electrode line 131 is disposed close to one of the two adjacent gate lines 121. Each of the storage electrodes 133*a* and 133*b* has a fixed end portion connected to the stem and a free end portion disposed opposite thereto. The fixed end portion of the storage electrode 133*b* has a large area, and the free end portion thereof is bifurcated into a linear branch and a curved branch. However, while a particular embodiment has been illustrated and described, the storage electrode lines 131 may have various other shapes and arrangements.

The gate lines 121 and the storage electrode lines 131 are preferably made of an Al-containing metal such as Al and an Al alloy, a Ag-containing metal such as Ag and a Ag alloy, a Cu-containing metal such as Cu and a Cu alloy, a Mo-containing metal such as Mo and a Mo alloy, Cr, Ta, or Ti. They may have a multilayered structure including two conductive films (not shown) having different physical characteristics. In such a multilayer structure, one of the two films may be made of a low resistivity metal such as an Al-containing metal, an Ag-containing metal, and a Cu-containing metal for reducing signal delay or voltage drop, and the other film may be made of a material such as a Mo-containing metal, Cr, Ta, or Ti, which have good physical, chemical, and electrical contact characteristics with other materials such as ITO or IZO. Good examples of the combination of the two films include a lower Cr film and an upper Al alloy film and a lower Al film and an upper Mo film. However, the gate line 121 and the storage electrode line 131 may be made of various metals or conductors.

The lateral sides of the gate lines 121 and the storage electrode lines 131 are inclined relative to a surface of the substrate 110, and the inclination angle thereof ranges from about 30 to about 80 degrees.

A gate insulating layer 140 preferably made of silicon nitride (SiNx) or silicon oxide (SiOx) is formed on the gate lines 121 and the storage electrode lines 131 and may be further formed on the exposed surfaces of the substrate 110.

A plurality of semiconductor stripes 151 preferably made of hydrogenated a-Si or polysilicon are formed on the gate insulating layer 140. The semiconductor stripes 151 extend substantially in the longitudinal direction, a second direction substantially perpendicular to the first direction, and become wide near the gate lines 121 and the storage electrode lines 131 such that the semiconductor stripes 151 cover large areas of the gate lines 121 and the storage electrode lines 131. Each of the semiconductor stripes 151 includes a plurality of projections 154 branched out toward the gate electrodes 124.

A plurality of ohmic contact stripes and islands 161 and 165 are formed on the semiconductor stripes 151. The ohmic contact stripes and islands 161 and 165 are preferably made of n+ hydrogenated a-Si heavily doped with an n-type impurity such as phosphorous, or they may be made of silicide. Each ohmic contact stripe 161 includes a plurality of projections 163, and the projections 163 and the ohmic contact islands 165 are located in pairs on the projections 154 of the semiconductor stripes 151, and are spaced apart from each other to expose a channel on each of the projections 154.

The lateral sides of the semiconductor stripes 151 and the ohmic contacts 161 and 165 are inclined relative to the surface of the substrate 110, and the inclination angles thereof are preferably in a range of about 30 to about 80 degrees.

A plurality of data lines 171 and a plurality of drain electrodes 175 are formed on the ohmic contacts 161 and 165 and the gate insulating layer 140.

The data lines 171 transmit data signals and extend substantially in the longitudinal direction, the second direction, to intersect the gate lines 121. Each data line 171 also intersects the storage electrode lines 131 and runs between adjacent pairs of storage electrodes 133a and 133b that are provided in adjacent pixels. Each data line 171 includes a plurality of source electrodes 173 projecting toward the gate electrodes 124 and curved like a crescent or having a "C" or "U" shape, and an end portion 179 having a large area for contact with another layer or an external driving circuit. A data driving circuit (not shown) for generating the data signals may be mounted on an FPC film (not shown), which may be attached to the substrate 110, directly mounted on the substrate 110, or integrated with the substrate 110. The data lines 171 may extend to be connected to a driving circuit that may be integrated with the substrate 110.

The drain electrodes 175 are separated from the data lines 171 and disposed opposite to the source electrodes 173 with respect to the gate electrodes 124. Each of the drain electrodes 175 includes a wide end portion and a narrow end portion. The wide end portion overlaps a storage electrode line 131, and the narrow end portion is partly enclosed by the source electrode 173 with a "U" shape. The facing sides of the source and drain electrodes 173 and 175 include a plurality of protrusions 73k and 75k each having a semicircular shape. The facing protrusions 73k and 75k of the source and drain electrodes 173 and 175 are both offset and engaged so as to be complementarily arranged.

A gate electrode 124, a source electrode 173, and a drain electrode 175 along with a projection 154 of a semiconductor stripe 151 form a TFT having a channel formed on the projection 154 disposed between the source electrode 173 and the drain electrode 175. The widths of the channels of the TFTs may be extended through the protrusions 73k and 75k.

The data lines 171 and the drain electrodes 175 are preferably made of a refractory metal such as Cr, Mo, Ti, Ta, or alloys thereof. They may also have a multilayered structure including a low-resistivity film (not shown) and a good-contact film (not shown). Good examples of such a combination include a lower Mo film, an intermediate Al film, and an upper Mo film as well as the above-described combinations of a lower Cr film and an upper Al—Nd alloy film and a lower Al film and an upper Mo film. However, the data lines 171 and the drain electrodes 175 may be made of various metals or conductors.

The data lines 171 and the drain electrodes 175 have inclined edge profiles with respect to the substrate 110, and the inclination angles thereof range from about 30 to about 80 degrees.

The ohmic contacts 161 and 165 are interposed only between the underlying semiconductor stripes 151 and the overlying conductors 171 and 175 thereon, and reduce the contact resistance there between. Although the semiconductor stripes 151 are narrower than the data lines 171 at most places, the width of the semiconductor stripes 151 becomes large near the gate lines 121 and the storage electrode lines 131 as described above, to smooth the profile of the surface, thereby preventing disconnection of the data lines 171. The semiconductor stripes 151 have almost the same planar shapes as the data lines 171 and the drain electrodes 175 as well as the underlying ohmic contacts 161 and 165. However, the semiconductor stripes 151 include some exposed portions, which are not covered with the data lines 171 and the drain electrodes 175, such as portions located between the source electrodes 173 and the drain electrodes 175 which define the channels of the TFTs.

A passivation layer 180 is formed on the data lines 171 and the drain electrodes 175, and on the exposed portions of the semiconductor stripes 151 and the exposed portions of the gate insulating layer 140. The passivation layer 180 is preferably made of an inorganic or organic insulator and it may have a flat top surface. Examples of the inorganic insulator material include silicon nitride and silicon oxide. The organic insulator may have photosensitivity and a dielectric constant of less than about 4.0. The passivation layer 180 may include a lower film of an inorganic insulator and an upper film of an organic insulator such that it takes the excellent insulating characteristics of the organic insulator while preventing the exposed portions of the semiconductor stripes 151 from being damaged with the organic insulator.

The passivation layer 180 has a plurality of contact holes 182 and 185 exposing the end portions 179 of the data lines 171 and the drain electrodes 175, respectively. The passivation layer 180 and the gate insulating layer 140 have a plurality of contact holes 181 exposing the end portions 129 of the gate lines 121, a plurality of contact holes 183a exposing portions of the storage electrode lines 131 near the fixed end portions of the storage electrodes 133a, and a plurality of contact holes 183b exposing the linear branches of the free end portions of the storage electrodes 133a.

A plurality of pixel electrodes 191, a plurality of overpasses 83, and a plurality of contact assistants 81 and 82 are formed on the passivation layer 180. They are preferably made of a transparent conductor such as ITO or IZO, or a reflective conductor such as Ag, Al, Cr, or alloys thereof.

The pixel electrodes 191 are physically and electrically connected to the drain electrodes 175 through the contact holes 185 such that the pixel electrodes 191 receive data voltages from the drain electrodes 175. The pixel electrodes 191 that are supplied with the data voltages generate electric fields in cooperation with a common electrode (not shown) of the opposing common electrode panel (not shown) supplied with a common voltage, which determine the orientations of liquid crystal molecules of a liquid crystal layer (not shown) disposed between the TFT panel and the common electrode panel. A pixel electrode 191 and the common electrode form a capacitor referred to as a "liquid crystal capacitor," which stores applied voltages after the TFT turns off.

A pixel electrode 191 overlaps a storage electrode line 131 including storage electrodes 133a and 133b. The pixel electrode 191 and a drain electrode 175 connected thereto and the storage electrode line 131 form an additional capacitor referred to as a "storage capacitor," which enhances the voltage storing capacity of the liquid crystal capacitor.

The overpasses 83 cross over the gate lines 121 and are connected to the exposed portions of the storage electrode lines 131 and the exposed linear branches of the free end portions of the storage electrodes 133a through the contact holes 183a and 183b, respectively, which are disposed opposite each other with respect to the gate lines 121. The storage electrode lines 131 including the storage electrodes 133a and 133b along with the overpasses 83 can be used for repairing defects in the gate lines 121, the data lines 171, or the TFTs.

The contact assistants 81 and 82 are connected to the end portions 129 of the gate lines 121 and the end portions 179 of the data lines 171 through the contact holes 181 and 182, respectively. The contact assistants 81 and 82 protect the end portions 129 and 179 and enhance the adhesion between the end portions 129 and 179 and external devices.

As described above, the channel of a TFT is formed with various shapes such that the length of the channel is prevented from being extended by the skew phenomenon and the width of the channel may be extended.

Although exemplary embodiments of the present invention have been described hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A display comprising:
   a substrate;
   a control electrode formed on the substrate;
   input and output electrodes formed on the substrate comprising facing sides facing each other with respect to the control electrode;
   a semiconductor layer contacting the input and output electrodes; and
   an insulating layer formed between the control electrode and the semiconductor layer,
   wherein at least one of the facing sides of the input and output electrodes on the semiconductor layer comprises a plurality of protrusions, wherein the protrusions of the input and output electrodes comprise a right triangle shape comprising an oblique side and a right side.

2. The display of claim 1, wherein the oblique side of each protrusion of the input electrode faces the right side of each corresponding protrusion of the output electrode.

3. The display of claim 1, wherein the oblique side of each protrusion of the input electrode faces the oblique side of each protrusion of the output electrode.

4. A display comprising:
   a substrate;
   a control electrode formed on the substrate;
   input and output electrodes formed on the substrate comprising facing sides facing each other with respect to the control electrode;
   a semiconductor layer contacting the input and output electrodes; and
   an insulating layer formed between the control electrode and the semiconductor layer,
   wherein at least one of the facing sides of the input and output electrodes on the semiconductor layer comprises a plurality of protrusions, and
   wherein the protrusions comprise a trapezoidal shape.

5. The display of claim 4, wherein the trapezoidal shape of the protrusions of the input and output electrodes are symmetrical with respect to a center line between the input and output electrodes.

6. A display comprising:
   a substrate;
   a control electrode formed on the substrate;
   input and output electrodes formed on the substrate comprising facing sides facing each other with respect to the control electrode;
   a semiconductor layer contacting the input and output electrodes; and
   an insulating layer formed between the control electrode and the semiconductor layer,
   wherein at least one of the facing sides of the input and output electrodes on the semiconductor layer comprises a plurality of protrusions, and
   wherein the protrusions comprise a semicircular shape.

7. The display of claim 1, wherein the protrusions of the input and output electrodes are alternately disposed.

8. The display of claim 1, wherein sizes of the protrusions of the input and output electrodes are substantially same.

9. The display of claim 1, wherein sizes of the protrusions of the input and output electrodes are different.

10. The display of claim 1, wherein neighboring protrusions of the input electrode are directly connected to each other and neighboring protrusions of the output electrode are directly connected to each other.

11. The display of claim 1, wherein neighboring protrusions of the input electrode are connected to each other with a predetermined interval there between and neighboring protrusions of the output electrode are connected to each other with a predetermined interval there between.

12. The display of claim 1, further comprising:
   a pixel electrode connected to the output electrode;
   a common electrode facing the pixel electrode; and
   an organic light emitting member formed between the pixel electrode and the common electrode.

13. The display of claim 1, wherein a channel is formed between the facing sides of the input and output electrodes, and a first dimension of the channel measured from a first end of the channel to a second end of the channel, which is greater than a linear distance measured from a first end of the input and output electrodes to a second end of the input and output electrodes, is maximized by the protrusions.

14. The display of claim 13, wherein the protrusions prevent a second dimension of the channel, measured between the facing sides of the input and output electrodes, from becoming over-etched during manufacture of the input and output electrodes.

15. A display comprising:
   a substrate;
   first and second signal lines intersecting each other and formed on the substrate;
   a driving voltage line formed on the substrate and transmitting a first voltage;
   a first thin film transistor connected to the first and second signal lines, and comprising a first input electrode and a first output electrode; and
   a second thin film transistor connected to the first thin film transistor and the driving voltage line, and comprising a control electrode formed on the substrate, a second input electrode and a second output electrode formed on the substrate and comprising facing sides facing each other with respect to the control electrode, a semiconductor layer contacting the second input and second output electrodes, and an insulating layer formed between the control electrode and the semiconductor layer,
wherein at least one of the facing sides of the second input and second output electrodes on the semiconductor layer comprise a plurality of protrusions, and neither of the first input or first output electrode comprise a protrusion.

16. The display of claim 15, further comprising:
a passivation layer formed on the first and second thin film transistors, the;
a first electrode connected to the second thin film transistor and formed in the passivation layer;
a second electrode facing the first electrode and transmitting a second voltage; and
an organic light emitting member formed between the first electrode and the second electrode.

* * * * *